US012660408B2

(12) United States Patent
Sekimoto et al.

(10) Patent No.: US 12,660,408 B2
(45) Date of Patent: Jun. 16, 2026

(54) ORGANIC EL ELEMENT, ORGANIC EL DISPLAY PANEL, AND ORGANIC EL ELEMENT MANUFACTURING METHOD

(71) Applicant: Magnolia Blue Corporation, Tokyo (JP)

(72) Inventors: Yasuhiro Sekimoto, Tokyo (JP);
Shinichiro Ishino, Tokyo (JP);
Toshiyuki Akiyama, Tokyo (JP);
Tomohiko Oda, Tokyo (JP);
Muneharu Sato, Tokyo (JP)

(73) Assignee: MAGNOLIA BLUE CORPORATION, Tokyo (JP)

( * ) Notice: Subject to any disclaimer, the term of this patent is extended or adjusted under 35 U.S.C. 154(b) by 959 days.

(21) Appl. No.: 17/557,072

(22) Filed: Dec. 21, 2021

(65) Prior Publication Data

US 2022/0199930 A1      Jun. 23, 2022

(30) Foreign Application Priority Data

Dec. 21, 2020 (JP) .................................. 2020-211429
Dec. 16, 2021 (JP) .................................. 2021-204329

(51) Int. Cl.
| | |
|---|---|
| *H10K 101/40* | (2023.01) |
| *H10K 50/11* | (2023.01) |
| *H10K 50/17* | (2023.01) |
| *H10K 71/40* | (2023.01) |

(52) U.S. Cl.
CPC ........... *H10K 50/11* (2023.02); *H10K 50/171* (2023.02); *H10K 71/40* (2023.02); *H10K 2101/40* (2023.02)

(58) Field of Classification Search
None
See application file for complete search history.

(56) References Cited

U.S. PATENT DOCUMENTS

2010/0148341 A1    6/2010   Fuji et al.
2020/0365820 A1*  11/2020   Sekimoto ............... H10K 71/00

FOREIGN PATENT DOCUMENTS

| CN | 110957435 A | * | 4/2020 | ........... H10K 50/121 |
|---|---|---|---|---|
| JP | 2008-187205 A | | 8/2008 | |
| JP | 2010-171368 A | | 8/2010 | |

| JP | 2018-186218 A | 11/2018 |
|---|---|---|
| JP | 2020077628 A | 5/2020 |
| JP | 2020-188199 A | 11/2020 |

OTHER PUBLICATIONS

Springer, Ramon, et al. "Cool white light-emitting three stack OLED structures for AMOLED display applications." Optics Express 24.24 (2016): 28131-28142. (Year: 2016).*

Zhao, Xuesen, et al. "Efficient organic blue fluorescent light-emitting devices with improved carriers' balance on emitter molecules by constructing supplementary light-emitting layer." Dyes and Pigments 130 (2016): 148-153. (Year: 2016).*

Young Kim, Woo, et al. "Spectroscopic study of white organic light-emitting devices with various thicknesses of emissive layer." Journal of Applied Physics 111.1 (2012). (Year: 2012).*

Ban, Xinxin, et al. "Design of high triplet energy electron transporting material for exciplex-type host: Efficient blue and white phosphorescent OLEDs based on solution processing." Organic Electronics 33 (2016): 9-14. (Year: 2016).*

Machine translation of CN-110957435-A, translation generated Apr. 2025, 12 pages. (Year: 2025).*

Zheng, Xujun, et al. "Simultaneous harvesting of triplet excitons in OLEDs by both guest and host materials with an intramolecular charge-transfer feature via triplet-triplet annihilation." Journal of Materials Chemistry C 3.27 (2015): 6970-6978. (Year: 2015).*

Zhou, Dianli, et al. "Enhancement of both electroluminescent and ultraviolet detective properties in organic optoelectronic integrated device realized by two triplet-triplet annihilation materials." Synthetic Metals 220 (2016): 323-328. (Year: 2016).*

* cited by examiner

*Primary Examiner* — Robert S Loewe
(74) *Attorney, Agent, or Firm* — XSENSUS LLP

(57) ABSTRACT

An organic EL element including an anode, a cathode, and a light emitting layer between the anode and the cathode. The light emitting layer includes a fluorescent material and a host material. A difference between a lowest unoccupied molecular orbital (LUMO) level of the fluorescent material and a highest occupied molecular orbital (HOMO) level of the fluorescent material is less than or equal to a difference between a LUMO level and a HOMO level of the host material. The LUMO level of the fluorescent material is equal to or higher than the LUMO level of the host material. The HOMO level of the fluorescent material is equal to or higher than the HOMO level of the host material, and a difference in energy level between the HOMO level of the fluorescent material and the HOMO level of the host material is 0.3 eV or less.

6 Claims, 12 Drawing Sheets

FIG. 5A

| | Material combination | | HOMO level [eV] | | | Efficiency | |
|---|---|---|---|---|---|---|---|
| | Host | Fluorescent material | Host | Fluorescent material | ΔHOMO | $R_{TTF}$ | EQE relative value |
| Reference example | H-1 | D-1 | 5.9 | 5.4 | 0.5 | 25.4% | 1 |
| Embodiment 1 | H-1 | D-2 | 5.9 | 5.6 | 0.3 | 29.2% | 1.4 |
| Embodiment 2 | H-1 | D-3 | 5.9 | 5.7 | 0.2 | 33.2% | 2.3 |

FIG. 5B

| | Host material | Fluorescent material | | |
|---|---|---|---|---|
| | H-1 | D-1 | D-2 | D-3 |
| HOMO level | 5.9 eV | 5.4 eV | 5.6 eV | 5.7 eV |
| LUMO level | 3.0 eV | 2.7 eV | 2.9 eV | 3.0 eV |
| Energy gap | 2.9 eV | 2.7 eV | 2.7 eV | 2.7 eV |

ORGANIC EL ELEMENT, ORGANIC EL DISPLAY PANEL, AND ORGANIC EL ELEMENT MANUFACTURING METHOD

This application claims priority to Japanese Patent Application No. 2020-211429 filed Dec. 21, 2020, and Japanese Patent Application No. 2021-204329 filed Dec. 16, 2021, the contents of which are hereby incorporated by reference in their entirety.

BACKGROUND

Technical Field

The present disclosure relates to improvements in luminance efficiency and life of organic electroluminescence (EL) elements using fluorescent material as light emitting material.

Description of Related Art

In recent years, use of organic EL elements in display devices is becoming widespread.

An organic EL element has a structure in which at least a light emitting layer is sandwiched between an anode and a cathode. In the light emitting layer, exciton energy generated by recombination of electrons and holes is converted into light. In organic semiconductors, two types of excitons (excited states) exist depending on spin state of electrons, singlet excitons and triplet excitons. In fluorescent materials, energy of singlet excitons is converted to light.

Conventionally, in order to improve luminance efficiency of an organic EL element, techniques have been devised such as adjusting balance between electrons and holes (see, for example, JP 2008-187205) and using phosphorescent material that emits light via triplet excitons (see, for example, JP 2010-171368).

SUMMARY

An organic EL element pertaining to at least one aspect of the present disclosure is an organic EL element including an anode, a cathode, and a light emitting layer disposed between the anode and the cathode. The light emitting layer includes a fluorescent material and a host material. A difference between a lowest unoccupied molecular orbital (LUMO) level of the fluorescent material and a highest occupied molecular orbital (HOMO) level of the fluorescent material is less than or equal to a difference between a LUMO level and a HOMO level of the host material. The LUMO level of the fluorescent material is equal to or higher than the LUMO level of the host material. The HOMO level of the fluorescent material is equal to or higher than the HOMO level of the host material, and a difference in energy level between the HOMO level of the fluorescent material and the HOMO level of the host material is 0.3 eV or less.

According to the present specification, a high LUMO level or high HOMO level means that a difference between the level and the vacuum level of an electron is small, that is, a large potential energy of electrons in the level is indicated.

Further, when the LUMO level or HOMO level is equal to or higher than (or less than or equal to) a defined reference level, this indicates that a difference between a vacuum level of electrons and the LUMO level or HOMO level is the same as a difference between the defined reference level and the vacuum level of electrons, or smaller (or larger) than the difference between the defined reference level and the vacuum level of electrons. That is, the potential energy of electrons existing in the LUMO level or HOMO level is the same as the potential energy of electrons existing in the defined reference level, or larger (or smaller) than the potential energy of electrons existing in the defined reference level.

Further, in the embodiments and examples of the present specification, ionization potential of thin films was measured using a photoelectron spectroscope (Riken Keiki Co., Ltd. manufactured AC-3) and used as HOMO level value of materials. Optical absorption edges of thin films were measured using a spectrophotometer (Shimadzu Corporation manufactured SolidSpec-3700) to determine singlet exciton levels and energy gaps of materials. In principle, measurement and quantification of a material's LUMO level is studied by low-energy photoelectron spectroscopy or the like, but in the present specification, for convenience, values of singlet exciton levels measured by the methods described above are subtracted from HOMO level values to obtain LUMO levels.

BRIEF DESCRIPTION OF DRAWINGS

FIG. 5A is a table showing relationships between ΔHOMO values and luminance efficiency according to embodiments and a reference example. FIG. 5B is a table showing detailed values of HOMO level and LUMO level of host material and fluorescent material, according to embodiments and a reference example.

FIG. 8A illustrates a state in which a TFT layer is formed on a substrate, FIG. 8B illustrates a state in which an interlayer insulating layer is formed on the substrate, FIG. 8C illustrates a state in which pixel electrode material is formed on the interlayer insulating layer, FIG. 8D illustrates a state in which pixel electrodes are formed, and FIG. 8E illustrates a state in which a bank material layer is formed on the interlayer insulating layer and the pixel electrodes.

FIG. 9A illustrates a state in which banks are formed, FIG. 9B illustrates a state in which hole injection layers are formed on the pixel electrodes, and FIG. 9C illustrates a state in which hole transport layers are formed on the hole injection layers.

FIG. 10A illustrates a state in which light emitting layers are formed on the hole transport layers, FIG. 10B illustrates a state in which an electron injection control layer is formed on the light emitting layers and the banks, and FIG. 10C illustrates a state in which an electron transport layer is formed on the electron injection control layer.

FIG. 11A illustrates a state in which an electron injection layer is formed on the electron transport layer, FIG. 11B illustrates a state in which a counter electrode is formed on the electron injection layer, and FIG. 11C illustrates a state in which a sealing layer is formed on the counter electrode.

DETAILED DESCRIPTION

Figure 1:
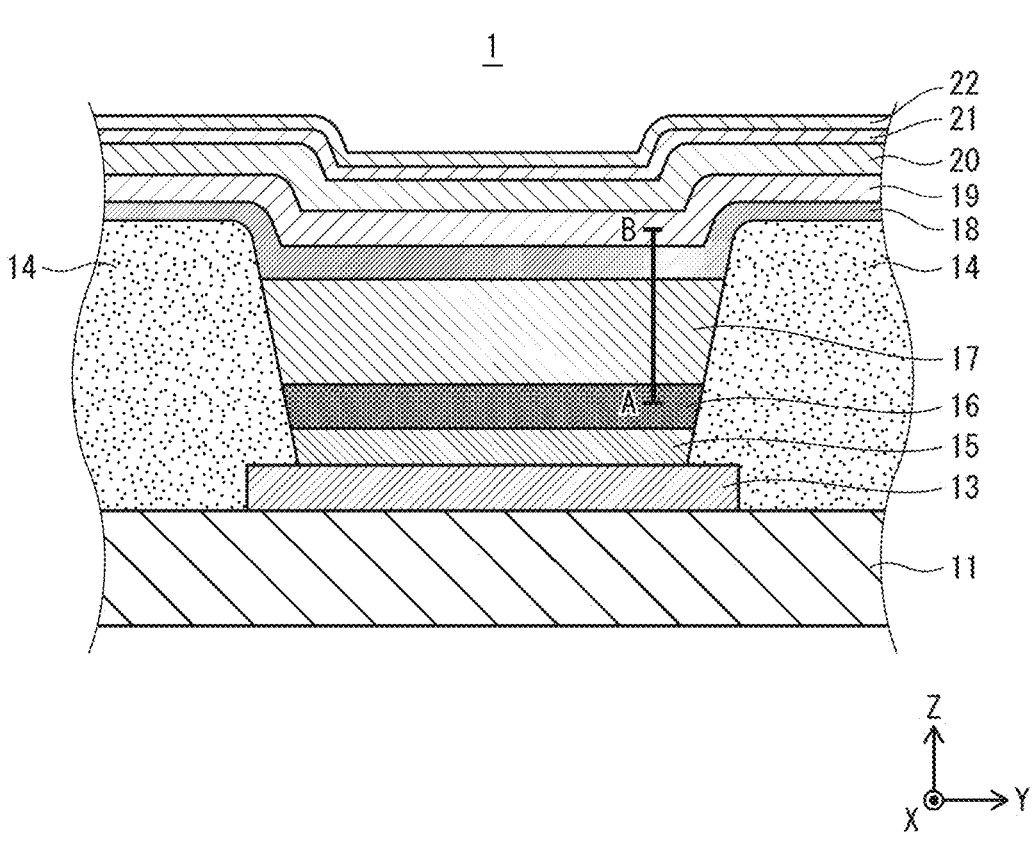
FIG. 1 is a cross section diagram schematically illustrating structure of an organic EL element 1 according to at least one embodiment.

«Background to an Aspect of the Present Disclosure»

In a blue light emitting element for an application such as a display, light emission by a fluorescent material having a narrow emission spectrum and excellent color purity is suitable, and improvement in efficiency of organic EL elements using a fluorescent material is sought.

In order to use an organic EL element as a light emitting element, it is essential to generate excitons that are a start state of light emission. Therefore, conventionally, hole injection from a hole transport layer to a light emitting layer, and electron injection from an electron transport layer to the light emitting layer are enhanced, and carrier density in the light emitting layer is improved to increase recombination probability of electrons and holes. Further, as a structure for further improving carrier density in the light emitting layer, a functional layer is selected that adjusts highest occupied molecular orbital (HOMO) level and/or lowest unoccupied molecular orbital (LUMO) level in order that hole leakage from the light emitting layer to the electron transport layer and electron leakage from the light emitting layer to the hole transport layer can be suppressed. According to such a structure, carrier density can be improved in the light emitting layer to increase electron and hole recombination probability.

There singlet excitons and triplet excitons in organic materials, depending on spin states of electrons. In fluorescent materials, as described above, singlet excitons contribute to light emission and triplet excitons do not contribute to light emission. On the other hand, the probability of generating singlet and triplet excitons is about 1:3, and improving density of singlet excitons is a technical problem.

Therefore, in order to utilize triplet excitons for light emission in fluorescent materials, the use of triplet-triplet fusion (TTF) is being studied, in which singlet excitons are generated from triplet excitons.

In fluorescent materials with low luminance efficiency, in particular blue light emitting materials and the like with short light emission wavelengths, the TTF phenomenon of colliding multiple triplet excitons to generate singlet excitons is being considered for use in improving the density of singlet excitons. In order to utilize TTF, it is necessary to improve density of triplet excitons.

Conventionally, when a light emitting layer is used in which a fluorescent material is dispersed in a host material, it is typical that the HOMO level of the fluorescent material is set higher than the HOMO level of the host material and/or the LUMO level of the fluorescent material is set lower than the LUMO level of the host material. By use of such a structure, holes and/or electrons injected into the light emitting layer are trapped by the fluorescent material, and therefore recombination in the fluorescent material is promoted and singlet excitons of the fluorescent material that directly contribute to light emission are generated.

However, the inventors have found that the above structure is not optimal for improving luminance efficiency using TTF. When recombination in fluorescent material is promoted, triplet excitons of the fluorescent material are also generated, but the fluorescent material has a low spatial density in the light emitting layer, and therefore the efficiency of generating singlet excitons of the fluorescent material by TTF is low. Further, in a structure where fluorescent material traps carriers (hole or electrons), localizing excitons by localizing carriers in the host material is difficult, and density of triplet excitons in the host material cannot be sufficiently increased.

In short, a conventional organic EL element using fluorescent material as a light emitting material has a structure suitable for generation of excitons in the fluorescent material, but density of triplet excitons is not sufficiently improved and the structure is not suitable for improving quantum efficiency using TTF.

Therefore, the inventors investigated a structure for sufficiently increasing density of triplet excitons to make maximum use of TTF, and arrived at an aspect of the present disclosure.

An object of the present disclosure is to improve luminance efficiency and lifespan by improving quantum efficiency by promoting TTF in an organic EL element in which a light emitting layers is formed using a host material and a fluorescent material.

«Aspects of Disclosure»

An organic EL element according to an aspect of the present disclosure is an organic EL element including an anode, a cathode, and a light emitting layer disposed between the anode and the cathode. The light emitting layer includes a fluorescent material and a host material. A The light emitting layer includes a fluorescent material and a host material. A difference between a LUMO level of the fluorescent material and a HOMO level of the fluorescent material is less than or equal to a difference between a LUMO level and a HOMO level of the host material. The LUMO level of the fluorescent material is equal to or higher than the LUMO level of the host material. The HOMO level of the fluorescent material is equal to or higher than the HOMO level of the host material, and a difference in energy level between the HOMO level of the fluorescent material and the HOMO level of the host material is 0.3 eV or less.

An organic EL element manufacturing method according to an aspect of the present disclosure is a manufacturing method including forming a first electrode on a substrate, forming a light emitting layer above the first electrode, and forming a second electrode above the light emitting layer. In the forming of the light emitting layer, a fluorescent material and a host material are used as materials of the light emitting layer, and the fluorescent material and the host material are selected such that a difference between a LUMO level of the fluorescent material and a HOMO level of the fluorescent material is less than or equal to a difference between a LUMO level and a HOMO level of the host material, the LUMO level of the fluorescent material is equal to or higher than the LUMO level of the host material, the HOMO level of the fluorescent material is equal to or higher than the HOMO level of the host material, and a difference in energy level between the HOMO level of the fluorescent material and the HOMO level of the host material is 0.3 eV or less.

In the organic EL element according to an aspect of the present disclosure or an organic EL element manufactured by the organic EL element manufacturing method according to an aspect of the present disclosure, electrons and holes are recombined in a host material having a high density in the light emitting layer. Accordingly, an increase in density of triplet excitons in the host material is facilitated, and luminance efficiency can be improved by using TTF, and therefore luminance efficiency of the light emitting layer can be improved, and an extension of life of the organic EL element can be expected.

According to at least one embodiment of the organic EL element, a distance between a light emission center of the light emitting layer and a cathode-side surface of the light emitting layer is shorter than a distance between the light emission center and an anode-side surface of the light emitting layer.

As a result, in the organic EL element in which recombination occurs in an area of the light emitting layer near the cathode-side surface of the light emitting layer, hole trapping by the fluorescent material can be reduced and triplet exciton density in the host material can be increased, and therefore the improvement of quantum efficiency by using TTF can be more strongly appreciated.

Further, according to at least one embodiment of the organic EL element, hole mobility of the light emitting layer is higher than electron mobility of the light emitting layer.

As a result, in the organic EL element in which hole mobility is high and electron injection into the light emitting layer is the rate determining process of recombination, an area having a locally high hole density is formed in the light emitting layer and density of triplet excitons can be improved, and therefore the improvement of quantum efficiency by using TTF can be more strongly appreciated.

According to at least one embodiment of the organic EL element, energy of singlet excitons of the host material is equal to or higher than energy of singlet excitons of the fluorescent material.

As a result, the fluorescent material is excited by energy of singlet excitons of the host material, and generation of singlet excitons of the fluorescent material that contributes to light emission is facilitated, and therefore singlet excitons generated by recombination in the host material and TTF efficiently contribute to light emission.

Further, according to at least one embodiment, the organic EL element further includes an electron injection control layer and an intermediate layer between the light emitting layer and the cathode. The electron injection control layer is in contact with both the light emitting layer and the intermediate layer, the intermediate layer has at least one of a property of facilitating electron injection and a property of facilitating electron transport, and a LUMO level of functional material contained in the electron injection control layer is 0.1 eV or more higher than a LUMO level of functional material contained in the intermediate layer and is higher than the LUMO level of the host material.

As a result, hole trapping caused by the fluorescent material in the light emitting layer is reduced and electron injectivity into the light emitting layer is controlled, and therefore carrier balance in the light emitting layer can be appropriately controlled and quantum efficiency of the organic EL element can be further improved.

An organic EL display panel according to at least one aspect of the present disclosure is an organic EL display panel including a plurality of the organic EL elements disposed on a substrate.

<<Embodiments>>

The following describes an organic EL element according to at least one embodiment. The following description is of an illustrative example for explaining structure, action, and effect pertaining to an aspect of the present invention, and does not limit the present invention to the embodiments described, except for essential elements of the present invention.

[1. Organic EL Element Structure]

FIG. 1 is a cross section diagram schematically illustrating structure of an organic EL element 1 according to at least one embodiment. The organic EL element 1 includes a pixel electrode 13 (anode), a hole injection layer 15, a hole transport layer 16, a light emitting layer 17, an electron injection control layer 18, an electron transport layer 19, an electron injection layer 20, and a counter electrode 21 (cathode).

In the organic EL element 1, the pixel electrode 13 and the counter electrode 21 are arranged such that their respective main surfaces face each other, either side of the light emitting layer 17.

On a side of the light emitting layer 17 nearest the anode (pixel electrode 13), the hole transport layer 16 is in contact with the light emitting layer 17. The hole injection layer 15 is disposed between the hole transport layer 16 and the anode (pixel electrode 13).

On a side of the light emitting layer 17 nearest the cathode (counter electrode 21), the electron injection control layer 18 is in contact with the light emitting layer 17, and the electron transport layer 19 is disposed in contact with the electron injection control layer 18. The electron injection layer 20 is disposed between the electron transport layer 19 and the cathode (counter electrode 21).

[1.1 Organic EL Element Structural Elements]

<Pixel Electrode>

The pixel electrode 13 is disposed on an interlayer insulating layer 12. The pixel electrode 13 is provided in a plurality, in one-to-one correspondence with pixels, and each of the pixel electrodes 13 is electrically connected to a thin film transistor (TFT) layer 112 through a contact hole provided in the interlayer insulating layer 12.

According to at least one embodiment, the pixel electrodes 13 function as light reflective anodes.

Material of the pixel electrode 13 is, for example, a light reflective metal material. Specific examples of the light reflective metal material include silver (Ag), aluminum (Al), aluminum alloy, molybdenum (Mo), alloy of silver, palladium, and copper (APC), alloy of silver, rubidium, and gold (ARA), alloy of molybdenum and chromium (MoCr), alloy of molybdenum and tungsten (MoW), alloy of nickel and chromium (NiCr), and the like. The pixel electrode 13 may be composed of a single metal layer, or may be a laminated structure in which a layer made of metal oxide such as indium tin oxide (ITO) or indium zinc oxide (IZO) is laminated on a metal layer.

When the counter electrode 21 is a light reflecting cathode, the pixel electrode 13 may be a light transmissive anode. In this case, the pixel electrode 13 includes at least one of a metal layer formed of a metal material and a metal oxide layer formed of a metal oxide. Examples of metal material of the pixel electrode 13 include Ag, silver alloy that has Ag as a main component, Al, and aluminum alloy that has Al as a main component. Examples of Ag alloy include magnesium silver alloy (MgAg) and indium silver alloy. Ag has low resistivity, and Ag alloy is preferable in that it has excellent heat resistance and corrosion resistance, and can maintain good electrical conductivity for a long period of time. Example of Al alloy include magnesium aluminum alloy (MgAl) and lithium aluminum alloy (LiAl). Examples of other alloys include lithium magnesium alloy and lithium indium alloy. Film thickness of the metal layer is set to be thin, from about 1 nm to 50 nm, to be light transmissive. The metal layer included in the pixel electrode 13 may be, for example, a single Ag layer or MgAg layer, a laminated structure of an Mg layer and an Ag layer (Mg/Ag), or a laminated structure of an MgAg alloy layer and an Ag layer (MgAg/Ag). Examples of metal oxide forming a metal oxide layer of the pixel electrode 13 include ITO and IZO. Further, the pixel electrode 13 may be composed of a single metal layer or a single metal oxide layer, or may have a laminated structure in which the metal oxide layer is laminated on the metal layer, or the metal layer is laminated on the metal oxide layer.

<Hole Injection Layer>

The hole injection layer 15 has a function of promoting injection of holes from the anode (pixel electrode 13) into the light emitting layer 17. The hole injection layer 15 is, for example, an applied film formed by, for example, applying and drying a solution of a hole injection material and a solute. The hole injection layer 15 may be formed by vapor deposition. The hole injection layer 15 is made of an electrically conductive polymer material such as poly(3,4-ethylenedioxythiophene) polystyrene sulfonate (PEDOT: PSS), polyfluorene, or a polyfluorene derivative, or an oxide of Ag, Mo, chromium (Cr), vanadium (V), tungsten (W), nickel (Ni), Iridium (Ir), or the like.

<Hole Transport Layer>

The hole transport layer 16 has a function of transporting holes injected from the hole injection layer 15 to the light emitting layer 17. The hole transport layer 16 is, for example, an applied film formed by, for example, applying and drying a solution of a hole transport material and a solute. The hole transport layer 16 may be formed by vapor deposition. For example, the hole transport layer 16 can be made of a polymer compound such as polyfluorene, a polyfluorene derivative, polyarylamine, or a polyarylamine derivative, and does not have a hydrophilic group.

<Light Emitting Layer>

The light emitting layer 17 has a function of emitting light by recombination of holes and electrons. The light emitting layer 17 is, for example, an applied film formed by, for example, applying and drying a solution of a material to form a light emitting layer and a solute. The light emitting layer 17 may be formed by vapor deposition.

The light emitting layer 17 is formed by doping a host material having a high carrier mobility with a fluorescent material. Here, high carrier mobility means high electron mobility and/or high hole mobility. Host material according to one aspect of the present disclosure has a higher hole mobility than electron mobility. As the host material, for example, an amine compound, a condensed polycyclic aromatic compound, or a heterocyclic compound can be used. As an amine compound, for example, a monoamine derivative, a diamine derivative, a triamine derivative, or a tetraamine derivative can be used. As a condensed polycyclic aromatic compound, for example, an anthracene derivative, a naphthalene derivative, a naphthacene derivative, a phenanthrene derivative, a chrysene derivative, a fluoranthene derivative, a triphenylene derivative, a pentacene derivative, and a perylene derivative can be used. As a heterocyclic compound, for example, a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, or a phthalocyanine derivative can be used.

As a fluorescent material for doping the light emitting layer 17, an organic material that is a known fluorescent substance can be used. Examples include a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, and acridine compound. According to at least one embodiment, concentration of the fluorescent material is 1 wt % or more. Further, according to at least one embodiment, concentration of the fluorescent material is 10 wt % or less. Further, according to at least one embodiment, concentration of the fluorescent material is 30 wt % or less.

Further, the fluorescent material is a blue light emitting material, and an energy level difference between LUMO level and HOMO level (the band gap, or energy of singlet excitons) is 2.6 eV or more.

In general, generated excitons have a characteristic that it is difficult for excitons to transition to an energy state having a higher energy. Therefore, in order for excitons recombined on host molecules to efficiently transition to an excited level of fluorescent light emitting material, singlet excited level of fluorescent light emitting material is preferably smaller than singlet excited level of host material. At the same time, in order to promote highly efficient carrier recombination in the host material, the fluorescent light emitting material preferably does not trap electrons flowing into the light emitting layer. Accordingly, in the light emitting layer, fluorescent material and host material are selected so that an absolute value of difference between the LUMO level of the fluorescent light emitting material and the HOMO level of the fluorescent light emitting material is less than or equal to an absolute value of difference between the LUMO level of the host material and the HOMO level of the host material, and the LUMO level of the fluorescent light emitting material is equal to or higher than the LUMO level of the host material.

The fluorescent material and the host material are selected so that the HOMO level of the fluorescent material is equal to or higher than the HOMO level of the fluorescent material and the difference in energy level is 0.3 eV or less. According to this structure, as described later, TTF can be maximally utilized and luminance efficiency can be improved. Further, energy of singlet excitons of the host material is preferably equal to or higher than energy of singlet excitons of the fluorescent material. According to this structure, energy of singlet excitons of the host material is transferred to the fluorescent material to generate singlet excitons, and therefore luminance efficiency can be improved by increasing generation efficiency of singlet excitons in the host material.

<Electron Injection Control Layer>

The electron injection control layer 18 is a layer responsible for electron injection into the light emitting layer, and is structured using one layer or multiple layers. In the present disclosure, the following layer structure is used as an example. The electron injection control layer 18 has a function of limiting leakage of holes from the light emitting layer 17 to the electron injection control layer 18 and a function of controlling injection of electrons from the electron transport layer 19 into the light emitting layer 17. As a result, electrons injected from the electron transport layer 19 accumulate near an interface between the electron injection control layer 18 and the electron transport layer 19, and therefore deterioration of light emitting material due to electron accumulation near an interface with the light emitting layer 17 is suppressed, which contributes to longer life. The functions of limiting leakage of holes from the light emitting layer 17 and controlling injection of electrons into the light emitting layer 17 are realized by the design of the energy band structure described later. In order to stably realize electron control by the electron injection control layer, an electron injection control layer film thickness capable of suppressing carrier tunnel effect is preferred, and according to at least one embodiment, film thickness of the electron injection control layer 18 is 5 nm or more. Further, according to at least one embodiment, film thickness of the electron injection control layer 18 is 10 nm or more. Further, from the viewpoint of reducing element drive voltage, electron injection control layer film thickness is preferably thin, and according to at least one embodiment, film thickness of the electron injection control layer 18 is 50 nm or less. Further, according to at least one embodiment, film thickness of the electron injection control layer 18 is 30 nm or less. Further, from the viewpoint of electron blocking, the electron injection control layer 18 has a higher LUMO level than the electron transport layer 19, and a difference in LUMO level between the electron injection control layer 18 and the electron transport layer 19 is 0.1 eV or more. On the other hand, a large LUMO barrier causes an increase in drive voltage and suppression of excess electron injection, and therefore the difference in LUMO level between the electron injection control layer 18 and the electron transport layer 19 is 0.5 eV or less.

Further, material of the electron injection control layer 18 is preferably selected so that energy of singlet excitons is larger than energy of singlet excitons of the host material of the light emitting layer 17. According to this structure, when singlet excitons are generated in material of the electron injection control layer 18, singlet exciton generation is facilitated in the fluorescent material by energy transfer to the host material or the fluorescent material, and when singlet excitons are generated in the host material or the fluorescent material of the light emitting layer 17, energy transfer to material of the electron injection control layer 18 can be suppressed. Similarly, energy of triplet excitons in material of the electron injection control layer 18 is preferably larger than energy of triplet excitons in material of the light emitting layer 17. The electron injection control layer 18 is, for example, a vapor deposition film.

Examples of material of the electron injection control layer 18 include π-electron low molecular weight organic materials such as a pyridine derivative, a pyrimidine derivative, a triazine derivative, an imidazole derivative, an oxadiazole derivative, a triazole derivative, a quinazoline derivative, a phenanthroline derivative, and the like.

<Electron Transport Layer>

The electron transport layer 19 has a function of transporting electrons from the cathode (counter electrode 21) to the light emitting layer 17 via the electron injection control layer 18. The electron transport layer 19 is made of an organic material having high electron transportability. The electron transport layer 19 is formed, for example, as a vapor deposition film. Examples of organic material used in the electron transport layer 19 include π-electron low molecular weight organic materials such as a pyridine derivative, a pyrimidine derivative, a triazine derivative, an imidazole derivative, an oxadiazole derivative, a triazole derivative, a quinazoline derivative, a phenanthroline derivative, and the like.

<Electron Injection Layer>

The electron injection layer 20 has a function of injecting electrons supplied from the cathode (counter electrode 21) towards the organic light emitting layers 17. The electron injection layer 20 is formed, for example, as a vapor deposition film. The electron injection layer 20 is, for example, an organic material that has high electron transportability, doped with a metal dopant selected from alkali metals, alkaline earth metals, lanthanoids, or the like. The metal dopant is not limited to a simple metal, and may be a compound such as a fluoride (for example, NaF), a quinolinium complex (for example, $Alq_3$, Liq), or the like. According to at least one embodiment, Li is doped as Liq. Examples of metal dopant include lithium (Li), sodium (Na), potassium (K), rubidium (Rb), cesium (Cs), francium (Fr), which correspond to alkali metals, calcium (Ca), strontium (Sr), barium (Ba), radium (Ra), yttrium (Y), which correspond to alkaline earth metals, and samarium (Sm), europium (Eu), ytterbium (Yb), and the like, which correspond to lanthanoids.

An example of an organic material used for the electron injection layer 20 is a π electron low molecular weight organic material such as an oxadiazole derivative (OXD), a triazole derivative (TAZ), a phenanthroline derivative (BCP, Bphen), or the like.

<Counter Electrode>

The counter electrode 21 is disposed on the election injection layer 20.

According to at least one embodiment, the counter electrode 21 functions as a somewhat light transmissive cathode.

Material of the counter electrode 21 includes at least one of a metal layer formed of a metal material and a metal oxide layer formed of a metal oxide. Examples of metal material forming the metal layer include Ag, a silver alloy that is mainly Ag, Al, and an Al alloy that is mainly Al. Examples of Ag alloy include magnesium silver alloy and indium silver alloy. Examples of Al alloy include magnesium aluminum alloy and lithium aluminum alloy. Examples of other alloys include lithium magnesium alloy and lithium indium alloy. The metal layer included in the counter electrode 21 may be, for example, a single Ag layer or MgAg layer, a laminated structure of an Mg layer and an Ag layer, or a laminated structure of an MgAg alloy layer and an Ag layer. Examples of metal oxide forming the metal oxide layer in the counter electrode 21 include ITO and IZO. Further, the counter electrode 21 may be composed of a single metal layer or a single metal oxide layer, or may have a laminated structure in which the metal oxide layer is laminated on the metal layer, or the metal layer laminated on the metal oxide layer.

When the pixel electrode 13 is a light transmissive anode, the counter electrode 21 may be a light reflective electrode. In this case, the counter electrode 21 includes a metal layer made of a light reflective metal material. Specific examples of metal material having light reflectivity include silver, aluminum, aluminum alloy molybdenum, APC, ARA, MoCr, MoW, NiCr, and the like.

<Other Elements>

The organic EL element 1 is on a substrate 11. The substrate 11 is composed of a base 111 that is an insulating material and the TFT layer 112 The base 111, for example, can be a glass substrate, a quartz substrate, a silicon substrate, a plastic substrate, or the like. As a plastic material, either a thermoplastic resin or a thermosetting resin may be used. For example, polyethylene, polypropylene, polyamide, polyimide (PI), polycarbonate, acrylic resin, polyethylene terephthalate (PET), polybutylene terephthalate, polyacetal, other fluororesins, various thermoplastic elastomers such as styrene, polyolefin, polyvinyl chloride, polyurethane, fluororubber, and chlorinated polyethylene based elastomers, epoxy resin, unsaturated polyester, silicone resin, polyurethane, and the like, or copolymers, blends, polymer alloys, or the like that are mainly composed of these, or a laminate of one or more of these can be used. As material of the TFT layer 112, examples include metal materials such as molybdenum sulfide, copper, zinc, aluminum, stainless steel, magnesium, iron, nickel, gold, and silver, inorganic semiconductor materials such as gallium nitride, gallium arsenide, and the like, organic semiconductor materials such as anthracene, rubrene, polyparaphenylene vinylene, and the like.

Further, although not shown, the interlayer insulating layer 12 is disposed on the substrate 11. The interlayer insulating layer 12 is made of a resin material and is for planarizing steps on an upper surface of the TFT layer 112. Examples of the resin material include positive photosensitive material. Further, as such a photosensitive material, an acrylic resin, a polyimide resin, a siloxane resin, or a phenol resin can be used. Further, a contact hole is formed in the interlayer insulating layer 12 for each pixel.

When the organic EL display panel 100 is a bottom emission panel, the base 111 and the interlayer insulating layer 12 need to be formed of a light transmissive material. Further, when the TFT layer 112 is present, at least part of an area below the pixel electrodes 13 in the TFT layer 112 needs to be light transmissive.

Further, a sealing layer 22 is disposed on the organic EL element 1. The sealing layer 22 has a function of suppressing exposure to moisture and air for organic layers such as the hole injection layer 15, the hole transport layer 16, the light emitting layer 17, the electron injection control layer 18, the electron transport layer 19, the electron injection layer 20, and the like, and is formed using a light transmissive material such as silicon nitride (SiN), silicon oxynitride (SiON), or the like. Further, a sealing resin layer made of a resin material such as an acrylic resin or silicone resin may be provided on a layer formed using a material such as silicon nitride (SiN) or silicon oxynitride (SiON).

When the organic EL display panel 100 is a top emission panel, the sealing layer 22 needs to be made of a light transmissive material. Although not shown in FIG. 1, a color filter or an upper substrate may be bonded onto the sealing layer 22 via a sealing resin. By bonding the upper substrate, the hole injection layer 15, the hole transport layer 16, the light emitting layer 17, the electron injection control layer 18, the electron transport layer 19, and the electron injection layer 20 can be protected from moisture, air, and the like.

[2. Energy Band Structure]

The organic EL element 1 is characterized by an energy band structure in the light emitting layer 17. For the light emitting layer 17, energy levels are indicated for fluorescent material and for host material, while for other layers, for simplicity, if composed of a single organic material, energy level of the organic material is indicated, and if composed of multiple organic materials, energy level of a representative organic material responsible for transporting electrons and/or holes is indicated as a "layer energy level".

Figure 2:
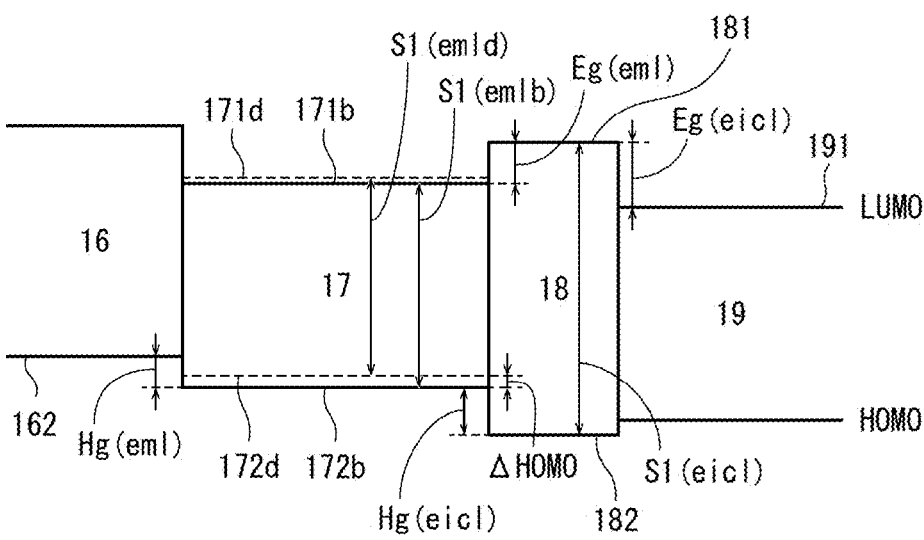
FIG. 2 is a simplified schematic diagram illustrating a band diagram of a hole transport layer, a light emitting layer, an electron injection control layer, and an electron transport layer according to at least one embodiment.

FIG. 2 is a band diagram illustrating an energy band structure of the organic EL element 1. In FIG. 2, LUMO energy level (also referred to as "LUMO level") and HOMO energy level (also referred to as "HOMO level") of the hole transport layer 16, the light emitting layer 17, the electron injection control layer 18, and the electron transport layer 19 are illustrated, and other layers are omitted. Although electron vacuum level is not shown in FIG. 2, for both the LUMO level and the HOMO level, the closer to the lower edge of the band diagram, the greater the difference from the electron vacuum level, and the lower the energy level.

[2.1. Light Emitting Layer]

The light emitting layer 17 is formed by doping a host material with a fluorescent material. In the light emitting layer 17, the host material is responsible for transporting carriers (electrons and/or holes). Accordingly, when the energy level of a HOMO level 172d of the fluorescent material is higher than that of a HOMO level 172b of the host material, the fluorescent material has a hole trapping property. A difference ΔHOMO between the HOMO level 172d of the fluorescent material and the HOMO level 172b of the host material preferably satisfies the following Expression (1).

$$\Delta HOMO \leq 0.3 \text{ eV} \qquad \text{Expression (1)}$$

Further, in the light emitting layer 17, it is preferable that energy of singlet excitons of the host material is transferred to the fluorescent material to generate singlet excitons of the fluorescent material. Accordingly, energy S1(emlb) of singlet excitons of the host material and energy S1(emld) of singlet excitons of the fluorescent material preferably satisfy the following Expression (2).

$$S1(emlb) \geq S1(emld) \qquad \text{Expression (2)}$$

Further, the light emitting layer 17 has higher hole mobility than electron mobility. When electron mobility of the light emitting layer 17 is μe(eml) and hole mobility is μh(eml), the following Expression (3) is preferably satisfied.

$$\mu h(eml) > \mu e(eml) \qquad \text{Expression (3)}$$

[2.2. Electron Injection Barrier]

An energy barrier for injection of electrons into the light emitting layer 17 from a cathode (counter electrode 21) side exists at interfaces of each layer from the cathode (counter electrode 21) to the light emitting layer 17. These energy barriers are caused by differences in LUMO levels at interfaces between anode (pixel electrode 13) side layers and cathode (counter electrode 21) side layers. Hereinafter, an energy barrier for injection of electrons from the cathode (counter electrode 21) side to the anode (pixel electrode 13) side of an interface between two adjacent layers is also referred to as an "electron injection barrier".

An electron injection barrier Eg(eicl) from the electron transport layer 19 to the electron injection control layer 18 is defined by a difference between a LUMO level 181 of the organic material of the electron injection control layer 18 and a LUMO level 191 of the organic material of the electron transport layer 19. The electron injection barrier Eg(eicl) preferably satisfies the following Expression (4). Further, Eg(eicl) more preferably satisfies the following Expression (5). According to at least one embodiment, the electron injection barrier Eg(eicl) is 0.1 eV.

$$Eg(eicl) \geq 0.1eV \qquad \text{Expression (4)}$$

$$Eg(eicl) \geq 0.2eV \qquad \text{Expression (5)}$$

An electron injection barrier Eg(eml) from the electron injection control layer 18 to the light emitting layer 17 is defined by a difference between a LUMO level 171b of the host material of the light emitting layer 17 and the LUMO level 181 of the organic material of the electron injection control layer 18. The LUMO level 171b of the host material of the light emitting layer 17 is equal to or lower than the LUMO level 181 of the organic material of the electron injection control layer 18, and the LUMO level 171b has the same or lower energy level than the LUMO level 181, and Eg(eml) preferably satisfies the following Expression (6). Further, Eg(eml) more preferably satisfies the following Expression (7). According to at least one embodiment, the electron injection barrier Eg(eml) is −0.1 eV.

$$Eg(eml) \leq 0 \qquad \text{Expression (6)}$$

$$Eg(eml) \leq -0.1eV \qquad \text{Expression (7)}$$

[2.3. Hole Injection Barrier]

On the other hand, energy barriers for injection of holes from an anode (pixel electrode 13) side via the light emitting layer 17 to a cathode (counter electrode 21) side exist at interfaces between each layer from the anode (pixel electrode 13) to the electron injection control layer 18. These energy barriers are caused by differences in HOMO levels at interfaces between cathode (counter electrode 21) side layers and anode (pixel electrode 13) side layers. Hereinafter, an energy barrier for injection of holes from the anode (pixel electrode 13) side to the cathode (counter electrode 21) side at the interface between two adjacent layers is also referred to as a "hole injection barrier".

A hole injection barrier Hg(eml) from the hole transport layer 16 to the light emitting layer 17 is defined by a difference between a HOMO level 172b of the host material of the light emitting layer 17 and a HOMO level 162 of the organic material of the hole transport layer 16. According to at least one embodiment, the hole injection barrier Hg(eml) is 0.1 eV.

A hole injection barrier Hg(eicl) from the light emitting layer 17 to the electron injection control layer 18 is defined by a difference between a HOMO level 182 of the organic material of the electron injection control layer and the HOMO level 172b of the host material of the light emitting layer 17. The hole injection barrier Hg(eicl) preferably satisfies the following Expression (8). Further, Hg(eicl) more preferably satisfies the following Expression (9). According to at least one embodiment, the hole injection barrier Hg(eicl) is 0.3 eV.

$$Hg(eicl) > 0 \qquad \text{Expression (8)}$$

$$Hg(eicl) \geq 0.3 \text{ eV} \qquad \text{Expression (9)}$$

[3. Effects of Structure]

[3.1. Expected Effects from Design]

Figure 3A:
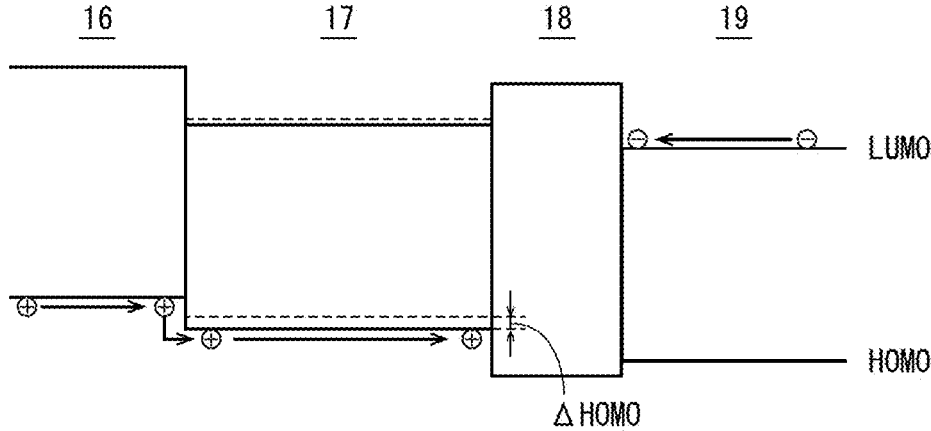
FIG. 3A, 3B, 3C are simplified schematic diagrams illustrating relationships between electron and hole recombination positions and band diagrams of hole transport layers, light emitting layers, electron injection control layers, and electron transport layers of at least one embodiment and a reference example.
Figure 3B:
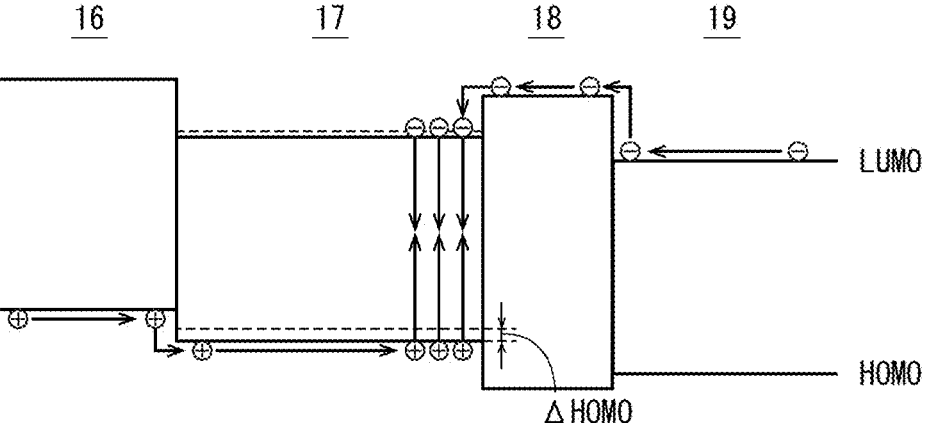
Figure 3C:
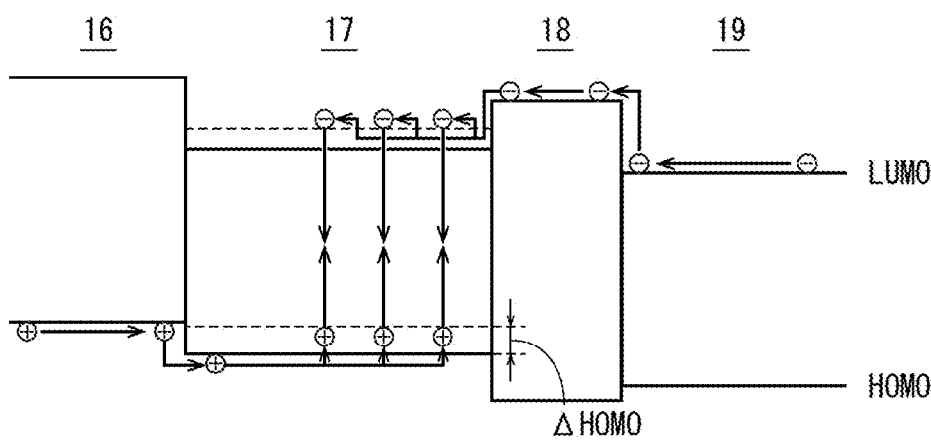

FIG. 3A, 3B, 3C are band diagrams of the hole transport layer 16, the light emitting layer 17, the electron injection control layer 18, and the electron transport layer 19 and simple schematic diagrams illustrating electron and hole recombination, pertaining to an embodiment and a reference example.

In the organic EL element according to at least one embodiment, as illustrated in the schematic diagram of FIG. 3A, holes are injected from the hole transport layer 16 to the host material of the light emitting layer 17. The difference ΔHOMO between the HOMO level 172b of the fluorescent material of the light emitting layer 17 and the HOMO level 172d of the host material of the light emitting layer 17 is as small as 0.3 eV or less, and therefore holes injected into the light emitting layer 17 are not trapped by the fluorescent material, and they move in the light emitting layer 17 to near the interface with the electron injection control layer 18. Then, as illustrated in the schematic diagram of FIG. 3B, holes accumulate in the light emitting layer 17 near the interface with the electron injection control layer 18 due to the hole injection barrier Hg(eicl) from the light emitting layer 17 to the electron injection control layer 18. On the other hand, due to the electron injection barrier Eg(eicl) from the electron transport layer 19 to the electron injection control layer 18, electron injection from the electron transport layer 19 to the electron injection control layer 18 becomes the rate-determining process for electron injection to the light emitting layer 17. Accordingly, a recombination area for electrons and holes in the light emitting layer 17 is limited to a narrow area near the interface with the electron injection control layer 18, and therefore exciton density can be easily improved and use of TTF is facilitated.

In contrast, FIG. 3C is a schematic diagram of a case in which the difference ΔHOMO between the HOMO level 172b of the fluorescent material of the light emitting layer 17 and the HOMO level 172d of the host material of the light emitting layer 17 is larger than 0.3 eV. In this case as well, electron injection from the electron transport layer 19 to the electron injection control layer 18 is the rate-determining process of electron injection into the light emitting layer 17. However, the difference ΔHOMO between the HOMO level 172b of the fluorescent material of the light emitting layer 17 and the HOMO level 172d of the host material is larger than 0.3 eV and therefore holes injected from the hole transport layer 16 into the light emitting layer 17 are trapped by the fluorescent material. Therefore, since recombination occurs in the fluorescent material in which holes are trapped, exciton density in the light emitting layer does not improve as much as in the embodiments, and TTF is less likely to occur.

[3.2. Energy Transfer in Light Emission]

The following describes energy transfer from recombination to light emission when the light emitting layer 17 includes a host material and a fluorescent material and energy of singlet excitons of the host material is equal to or greater than energy of singlet excitons of the fluorescent material.

Figure 4A:
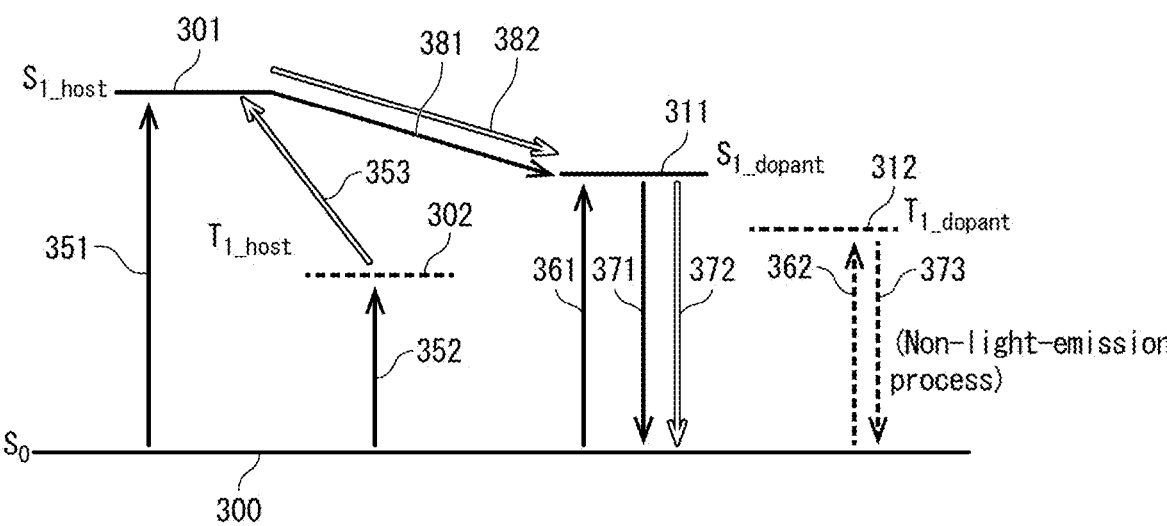
FIG. 4A is a schematic diagram illustrating exciton energy of host material and fluorescent material and state transitions.

FIG. 4A is a schematic band diagram illustrating electron energy states and transitions in the host material and the fluorescent material. In FIG. 4A, a ground level of the host material and a ground level of a fluorescent state are both the $S_0$ level, and energies of other levels are shown as values relative to the $S_0$ level.

When electrons and holes recombine in the host material, in the host material the electrons transition to an exciton level of the host material. At this time, some electrons transition to a singlet exciton level $S_{1\_host}$ 301 by an excitation process 351. Then, some or all singlet excitons of the host material generate singlet excitons in the fluorescent material by an energy transfer 381 to the fluorescent material in a ground state. This energy transfer occurs when electrons of the fluorescent material are excited from the ground level $S_0$ to a singlet exciton level $S_{1\_dopant}$ 311 using energy from electrons of the host material returning to a ground state. Then, some or all of singlet excitons of the fluorescent material are converted into photons, so that light is emitted by a light emission process 371.

On the other hand, when electrons and holes recombine in the host material, some electrons transition to a triplet exciton level $T_{1\_host}$ 302 by an excitation process 352. In general, transition from a triplet state to a singlet state is forbidden from the viewpoint of electron spin, and energy transfer to singlet excitons is extremely unlikely to occur. However, if triplet exciton density is high enough, singlet excitons are generated in the host material by TTF 353, which generates singlet excitons via collision of multiple triplet excitons. Some or all singlet excitons generated in the host material generate singlet excitons in the fluorescent material by an energy transfer 382 to the fluorescent material in a ground state. Then, some or all of singlet excitons of the fluorescent material are converted into photons, so that light is emitted by a light emission process 372.

Further, when electrons and holes recombine in the fluorescent material, in the fluorescent material electrons transition to an exciton level of the fluorescent material. At this time, some electrons transition to a singlet exciton level $S_{1\_dopant}$ 311 by an exciton process 361. Then, some or all of singlet excitons of the fluorescent material are converted into photons, so that light is emitted by a light emission process 371. On the other hand, some electrons transition to a triplet exciton level $T_{1\_dopant}$ 312 by an exciton process 362. The fluorescent material has a low physical density, and therefore TTF hardly occurs, and energy is converted into heat or the like by a non-light-emission process 373.

[3.3. Luminance Efficiency]

Luminance efficiency is examined below in consideration of processes from recombination to light emission as described above.

Figure 4B:
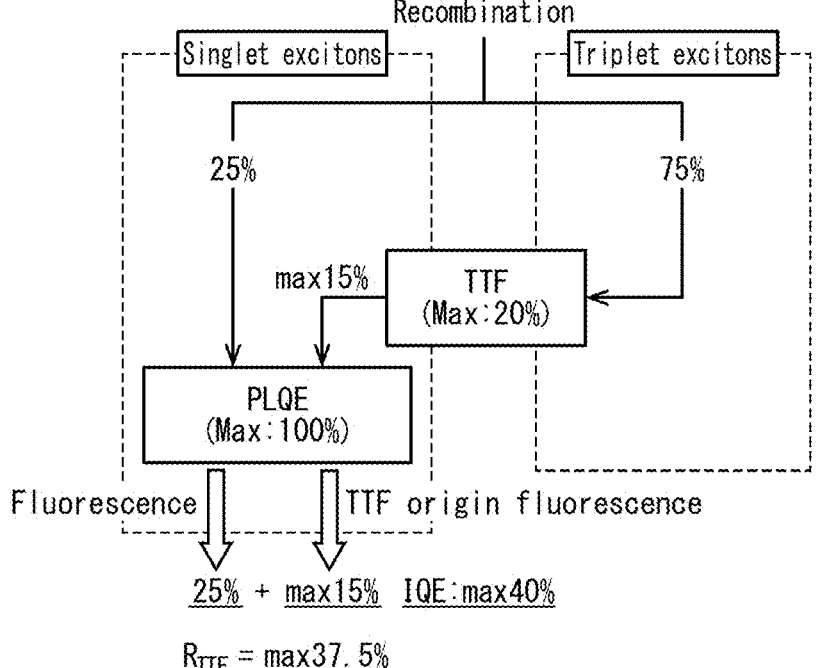
FIG. 4B is a state transition diagram illustrating exciton state transitions and maximum efficiency.

FIG. 4B is a schematic diagram illustrating state transitions and maximum efficiency from recombination to light emission, when the light emitting layer 17 includes a host material and a fluorescent material and energy of singlet excitons of the host material is equal to or greater than energy of singlet excitons of the fluorescent material.

Among excitons generated when electrons and holes recombine, a ratio of singlet excitons to triplet excitons is about 1:3. Therefore, with respect to the number of recombinations, 25% are generated as singlet excitons and 75% are generated as triplet excitons. Therefore, assuming that photoluminescence quantum efficiency (PLQE) of singlet excitons of the host material is 100%, then when TTF does not occur, a maximum of 25% of excitons generated by recombination contribute to light emission.

On the other hand, in TTF, one singlet exciton is generated from five triplet excitons. Therefore, when TTF occurs, a number of singlet excitons is generated up to 20% of the number of triplet excitons. That is, a maximum of 15% singlet excitons are generated with respect to the number of recombinations. Therefore, assuming that PLQE of singlet excitons of the host material is 100%, TTF contributes up to 15% of the excitons generated by recombination to light emission. Accordingly, a maximum value of internal quantum efficiency (IQE) is 40%. Hereinafter, contribution of TFF to luminance efficiency is indicated by $R_{TTF}$. The larger the $R_{TTF}$, the more efficiently TTF can be used, and the maximum value is 37.5% (=15/40).

[3.4. Evaluation Results]

The following describes characteristics of an organic EL element according to at least one embodiment together with evaluation results.

FIG. 5A shows HOMO levels of the host material and the fluorescent material of the light emitting layer 17, ΔHOMO, calculated $R_{TTF}$, and evaluation values of external quantum efficiency (EQE) for embodiments and a reference example. HOMO levels, LUMO levels, and energy gap values of the host material and the fluorescent materials of the light emitting layers 17 are shown in FIG. 5B. Each of the HOMO levels and LUMO levels is an absolute value of a difference from the vacuum level, and the larger the value, the lower the energy level. Only the fluorescent material is different between the embodiments and the reference example, and other constituent elements are the same. The fluorescent materials used in Embodiment 1, Embodiment 2, and the reference example all have the same energy gap, that is, the light emission peak wavelength is the same, and only differences in HOMO levels between the host material and the fluorescent materials and differences in LUMO levels between the host material and the fluorescent materials are different.

Figure 6A:
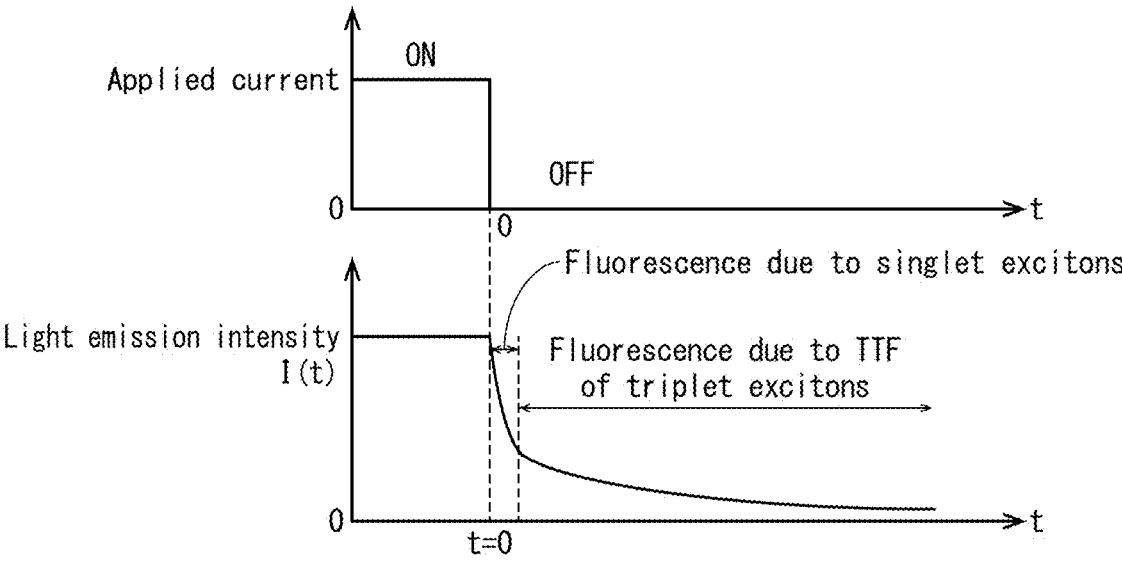
FIG. 6A is a schematic graph illustrating temporal transition of emission intensity in pulse emission.
Figure 6B:
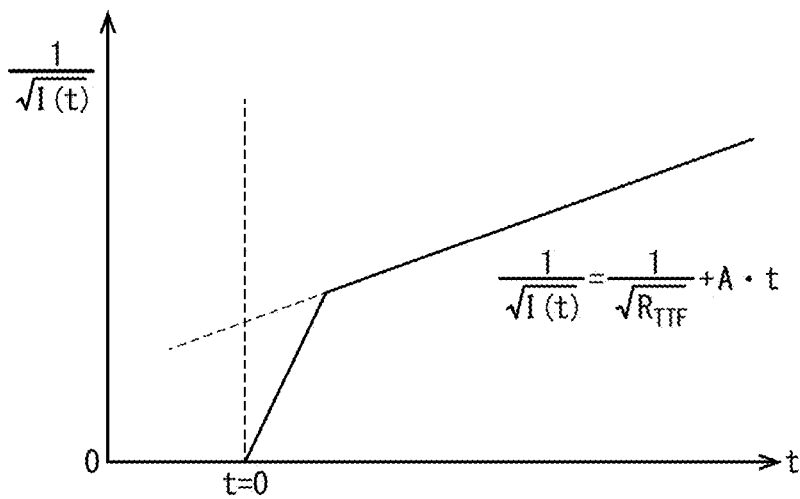
FIG. 6B is a schematic graph illustrating an outline of $R_{TTF}$ estimation based on the temporal transition of the emission intensity.

The following method was used to calculated $R_{TTF}$. FIG. 6A is a diagram illustrating an outline of an evaluation test for calculating $R_{TTF}$. In an evaluation test, an organic EL element was made to emit light by a pulse current, and immediately after the current was cut off, transition of light emission luminance was measured. Life of a singlet exciton is shorter than life of a triplet exciton, and therefore light emission due to singlet excitons of the fluorescent material generated directly by recombination and light emission due to energy transferred to the fluorescent material by singlet excitons of the host material generated directly by recombination is extinguished in a very short time when the current is cut off. On the other hand, emission by singlet excitons generated via the TTF process has a long life, and continues even after fluorescence due to singlet excitons not dependent on TTF ends. Accordingly, $R_{TTF}$ can be estimated from an attenuation profile of luminance intensity after the time of current cut off (t=0 in FIGS. 6A and 6B). More specifically, as shown in FIG. 6B, a relationship between luminance intensity I(t) at time t and $R_{TTF}$ can be approximated by the following Expression (10).

[Math 1]

$$\frac{1}{\sqrt{I(t)}} = \frac{1}{\sqrt{R_{TTF}}} + At \qquad \text{Expression (10)}$$

Figure 7A:
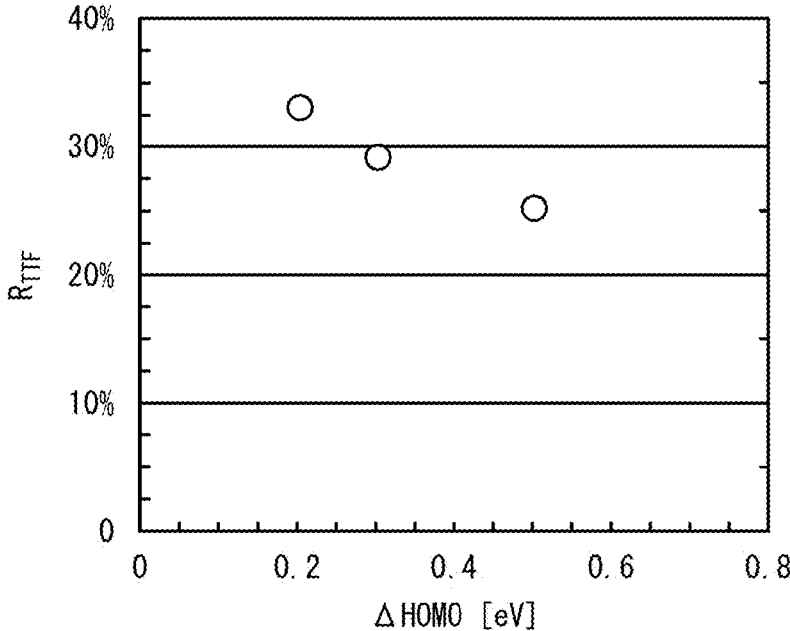
FIG. 7A is a graph showing a relationship between ΔHOMO values and $R_{TTF}$.
Figure 7B:
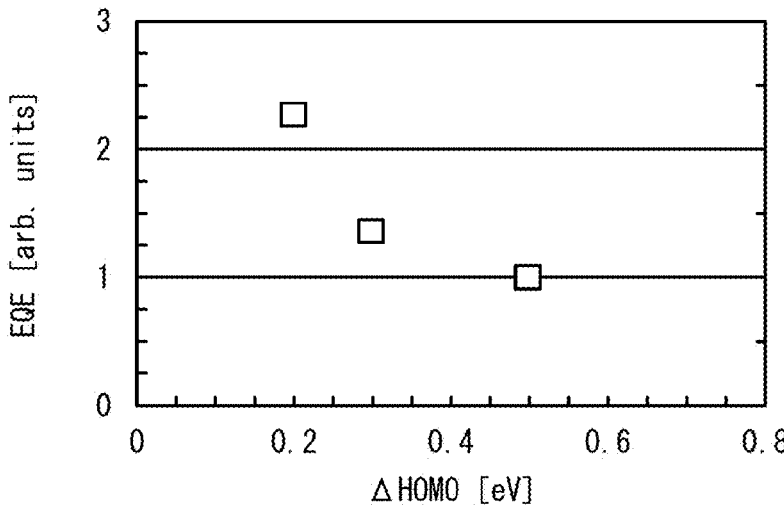
FIG. 7B is a graph showing a relationship between ΔHOMO values and quantum efficiency.

For each of the Embodiments 1 and 2 and the reference example, the $R_{TTF}$ measured at a rectangular pulse current of 10 mA/cm² is as shown in FIG. 5A, and the results are shown in FIG. 7A as a relationship between ΔHOMO and $R_{TTF}$. As illustrated in FIG. 5A and FIG. 7A, the smaller the ΔHOMO, the larger the $R_{TTF}$. As mentioned above, the maximum value of $R_{TTF}$ is 37.5%, and therefore it is particularly preferable that $R_{TTF}$ is about 30% or more in order to increase quantum efficiency. Accordingly, ΔHOMO is preferably 0.3 eV or less. Further, the EQE values of FIG. 5A for Embodiments 1 and 2 and the reference example are indicated as EQE values relative to a value of 1 for the reference example, and FIG. 7B indicates a relationship between EQE relative values and ΔHOMO. As indicated in FIG. 5A and FIG. 7B, according to the embodiments, a high EQE of 1.4 times or more that of the reference example is achieved.

In FIG. 5A, the EQE relative values are calculated based on measured values at an applied current of 10 mA/cm².

[3.5. Light Emission Center]

The following describes a light emission center in a light emitting layer. Light emission center refers to a representative position where peak light emission occurs, as described below. Position of peak light emission is a position where excitons of the host material are concentrated, and generally occurs at one or both of the interface on the cathode side of the light emitting layer and the interface on the anode side of the light emitting layer. If mobility of holes in the light emitting layer is sufficiently higher than mobility of electrons, the holes move to the cathode side interface of the light emitting layer, while electrons are consumed by recombination near the cathode side interface of the light emitting layer, and therefore excitons are intensively generated near the cathode side interface of the light emitting layer. On the other hand, if mobility of electrons in the light emitting layer is sufficiently higher than mobility of holes, the electrodes move to the anode side interface of the light emitting layer, while hole are consumed by recombination near the anode side interface of the light emitting layer, and therefore excitons are intensively generated near the anode side interface of the light emitting layer. Further, depending on a relationship between mobility of holes and mobility of electrons in the light emitting layer, excitons may be intensively generated both near the cathode side interface and near the anode side interface of the light emitting layer. In general, a position where excitons are intensively generated becomes a position of peak light emission.

If diffusion characteristics of excitons of the host material are high and exciton life is long, positions where excitons are intensively generated and positions of emission peaks may not always match due to diffusion of excitons. In such a case, the light emission center is not a position where excitons are intensively generated, but a position where transition from exciton energy to photon energy is intensively generated.

[4. Review]

As described above, in the organic EL element according to an aspect of the present disclosure, the light emitting layer 17 includes a host material and a fluorescent light emitting material, the HOMO level of the fluorescent light emitting material is equal to or higher than the HOMO level of the host material, and a difference in energy level is 0.3 eV or less. Accordingly, exciton density can be increased by reducing the number of holes trapped by the fluorescent light emitting material and increasing hole density in a narrow area near the cathode side interface of the light emitting layer 17. By increasing TTF generation efficiency by improving exciton density, quantum efficiency and luminance efficiency of the organic EL element can be increased, which can extend the life of the organic EL element.

Further, in the organic EL element according to an aspect of the present disclosure, the electron injection transport layer is provided between the electron transport layer and the light emitting layer, the LUMO level of the electron injection transport layer is at least 0.1 eV higher than the LUMO level of the electron transport layer, and higher than the LUMO level of the host material of the light emitting layer. Accordingly, recombination on the cathode side of the light emitting layer 17 is suppressed to suppress a decrease in luminance efficiency and deterioration of the electron transport layer, as well as appropriately maintaining carrier balance and improving recombination probability by appropriately controlling electron injection into the light emitting layer 17.

As described above, in the organic EL element according to at least one aspect of the present disclosure, electron and hole recombination occur in a host material having a high density in the light emitting layer. Accordingly, improvement of density of triplet excitons in the host material is facilitated, and luminance efficiency can be improved by use of TTE Accordingly, in an organic EL element in which the light emitting layer is formed by using the host material and the fluorescent material, luminance efficiency of the light emitting layer can be improved, and an extension of life of the organic EL element can be expected.

[5. Organic EL Element Manufacturing Method]

A method of manufacturing an organic EL element is described below with reference to the drawings. FIG. 8A to FIG. 11C are schematic cross section diagrams illustrating states in manufacturing an organic EL display panel including organic EL elements. FIG. 12 is a flowchart illustrating the method of manufacturing the organic EL display panel including the organic EL elements.

In the organic EL display panel, the pixel electrodes (lower electrodes) function as anodes of the organic EL elements, and the counter electrode (upper electrode, common electrode) functions as the cathode of the organic EL elements.

(1) Forming Substrate 11

Figure 8A:
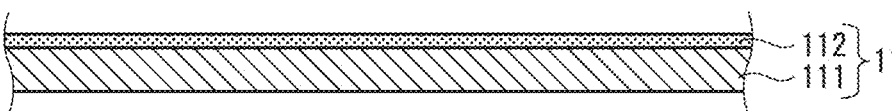
FIG. 8A, 8B, 8C, 8D, 8E are partial cross section diagrams schematically illustrating part of a process of manufacturing an organic EL element pertaining to at least one embodiment, where

First, as illustrated in FIG. 8A, the TFT layer 112 is formed on the base 111 to form the substrate 11 (step S10). The TFT layer 112 can be formed by a known TFT manufacturing method.

Figure 8B:
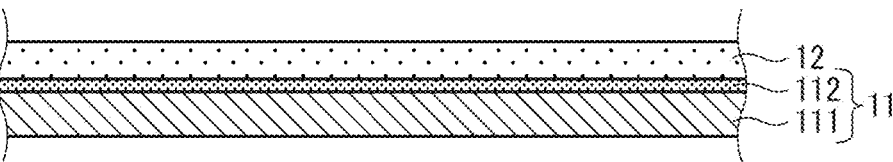

Next, as illustrated in FIG. 8B, the interlayer insulating layer 12 is formed on the substrate 11 (step S20). The interlayer insulating layer 12 can be formed, for example, by a plasma chemical vapor deposition (CVD) method, a sputtering method, or the like.

Next, contact holes are formed in the interlayer insulating layer 12 by performing a dry etching method at locations above source electrodes of the TFT layer. Contact holes are formed so that surfaces of the source electrodes are exposed at the bottom of the contact holes.

Next, connecting electrode layers are formed along inner walls of the contact holes. A portion of an upper part of each connecting electrode layer is disposed on the interlayer insulating layer 12. In forming the connecting electrode layers, for example, a sputtering method can be used, and after forming a metal film, patterning is performed using a photolithography method and a wet etching method.

(2) Forming Pixel Electrodes 13

Figure 8C:
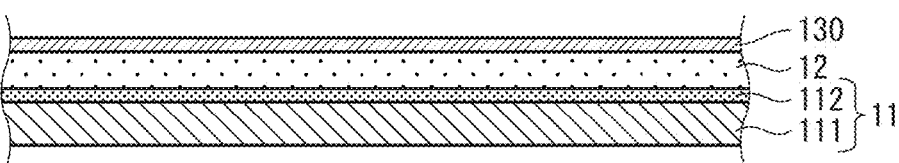

Next, as illustrated in FIG. 8C, a pixel electrode material layer 130 is formed on the interlayer insulating layer 12 (step S31). The pixel electrode material layer 130 can be formed by, for example, a vacuum deposition method, a sputtering method, or the like.

Figure 8D:
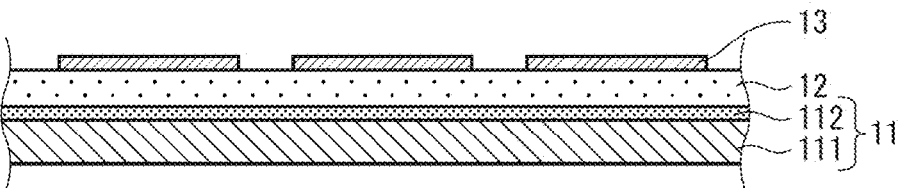

Then, as illustrated in FIG. 8D, the pixel electrode material layer 130 is patterned by etching to form the pixel electrodes 13 partitioned into sub pixels (step S32). The pixel electrodes 13 function as anodes of the organic EL elements.

A method of forming the pixel electrodes 13 is not limited to the above method. For example, a hole injection material layer 150 may be formed on the pixel electrode material layer 130, and the pixel electrode material layer 130 and the hole injection material layer 150 patterned together to form laminated structures of the pixel electrodes 13 and the hole injection layers 15.

(3) Forming Banks 14

Figure 8E:
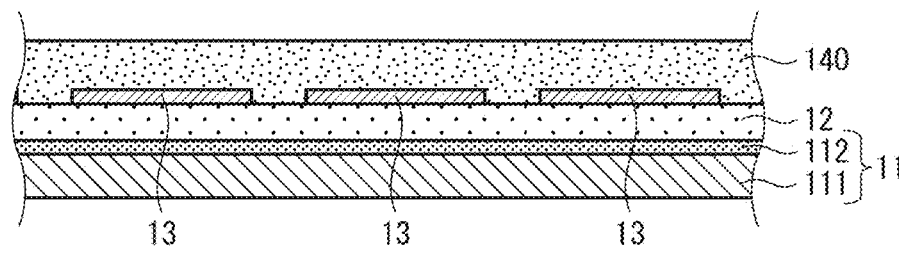
Figure 9A:
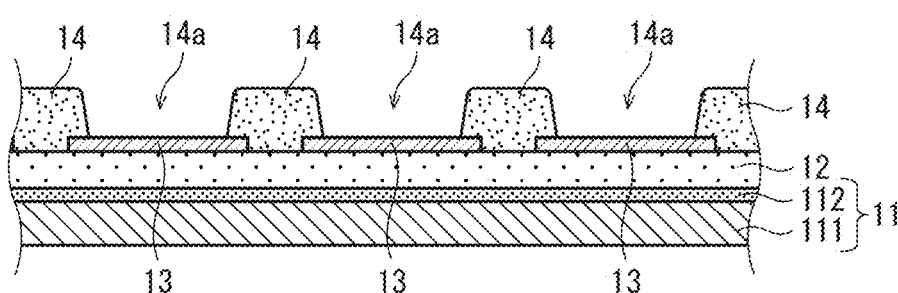
FIG. 9A, 9B, 9C are partial cross section diagrams schematically illustrating part of the process of manufacturing the organic EL element pertaining to at least one embodiment, where

Next, as illustrated in FIG. 8E, bank resin that is a material of the banks 14 is applied on the pixel electrodes 13 and the interlayer insulating layer 12 to form a bank material layer 140. The bank material layer 140 is formed by uniform application using a spin coating method or the like on the pixel electrodes 13 and the interlayer insulating layer 12, applying a solution of a phenol resin that is a bank layer resin dissolved in a solvent (for example, a mixed solvent of ethyl lactate and γ-Butyrolactone (GBL)) (step S41). Then, as illustrated in FIG. 9A, the banks 14 are formed by pattern exposure and development of the bank material layer 140 (step S42) and the banks 14 are baked. As a result, apertures 14a are defined, which are areas in which the light emitting layers 17 are formed. The banks 14 are baked, for example, at a temperature from 150° C. to 210° C. for 60 minutes.

Further, in forming the banks 14, surfaces of the banks 14 may be further surface treated with a defined alkaline solution, water, an organic solvent, or the like, or may be subjected to plasma treatment. This is done for the purpose of adjusting contact angle of the banks 14 with respect to ink (solution) applied to the apertures 14a, or for the purpose of imparting water repellency to the surfaces.

(4) Forming Hole Injection Layers 15

Figure 9B:
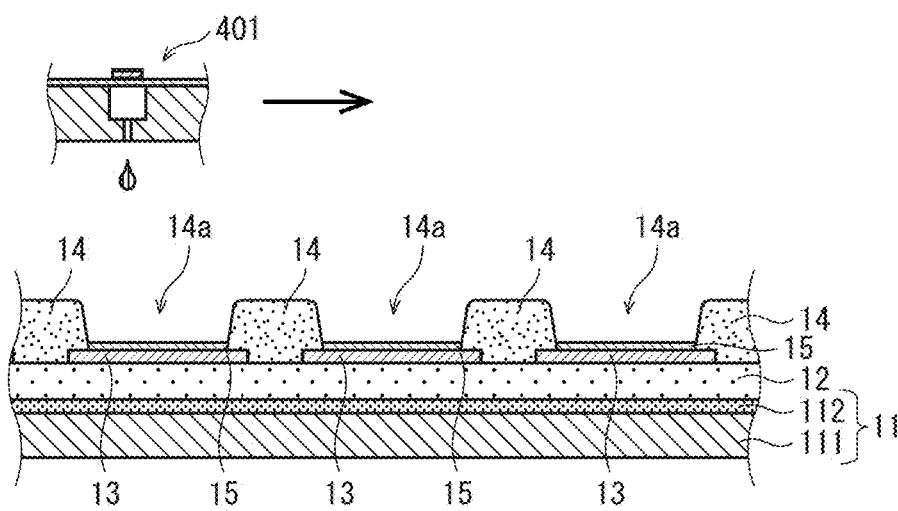

Next, as illustrated in FIG. 9B, ink containing constituent material of the hole injection layers 15 is ejected from nozzles of an inkjet head 401 into the apertures 14a defined by the banks 14 to be applied onto the pixel electrodes 13 in the apertures 14a, then baked (dried) to form the hole injection layers 15 (step S50).

(5) Forming Hole Transport Layers 16

Figure 9C:
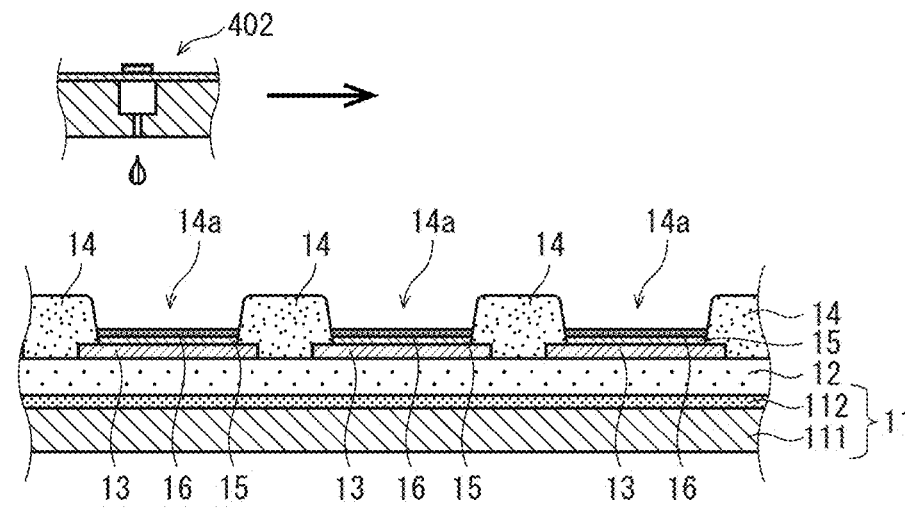

Next, as illustrated in FIG. 9C, ink containing constituent material of the hole transport layers 16 is ejected from nozzles of an inkjet head 402 into the apertures 14a defined by the banks 14 to be applied onto the hole injection layers 15 in the apertures 14a, then baked (dried) to form the hole transport layers 16 (step S60).

(6) Forming Light Emitting Layers 17

Figure 10A:
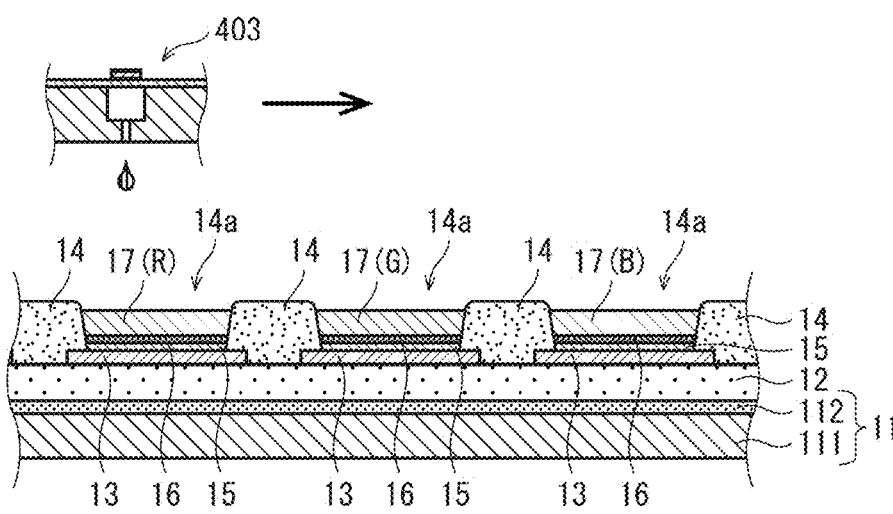
FIG. 10A, 10B, 10C are partial cross section diagrams schematically illustrating part of the process of manufacturing the organic EL element pertaining to at least one embodiment, where

Next, as illustrated in FIG. 10A, ink containing the host material and the fluorescent material of the light emitting layers 17 is ejected from nozzles of an inkjet head 403 to be applied onto the hole transport layers 16 in the apertures 14a, then baked (dried) to form the light emitting layers 17 (step S70).

(7) Forming Electron Injection Control Layer 18

Figure 10B:
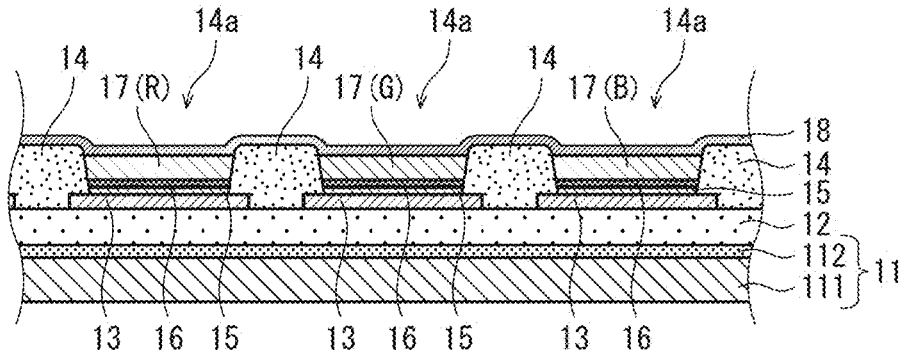

Next, as illustrated in FIG. 10B, the electron injection control layer 18 is formed on the light emitting layers 17 and the banks 14 (step S80). The electron injection control layer 18 is formed, for example, by vapor deposition of an organic compound that is a material of the electron injection control layer 18 to form a thin film common to every sub-pixel.

(8) Forming Electron Transport Layer 19

Figure 10C:
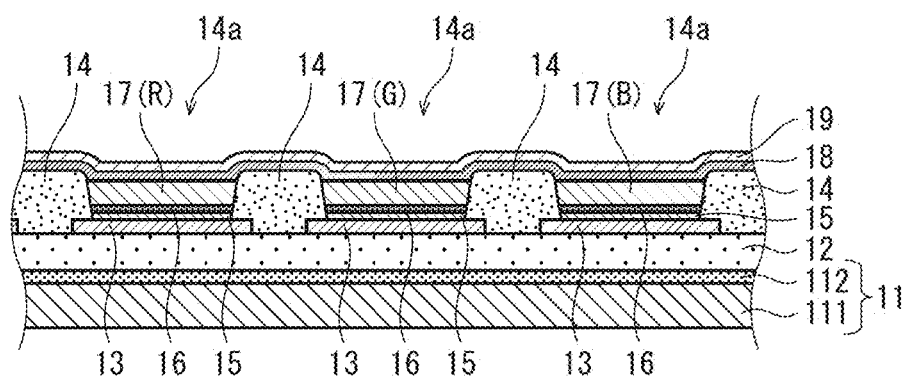

Next, as illustrated in FIG. 10C, the electron transport layer 19 is formed on the electron injection control layer 18 (step S80). The electron transport layer 19 is formed, for example, by vapor deposition of an organic compound that is a material of the electron transport layer 19 to form a thin film common to every sub-pixel.

(9) Forming Electron Injection Layer 20

Figure 11A:
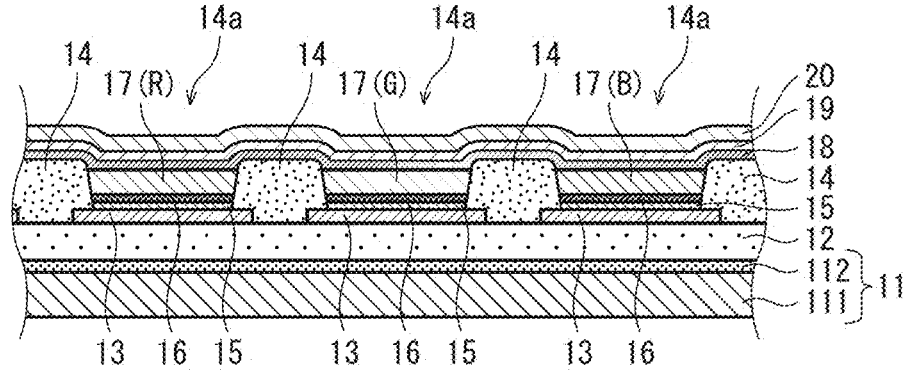
FIG. 11A, 11B, 11C are partial cross section diagrams schematically illustrating part of the process of manufacturing the organic EL element pertaining to at least one embodiment, where
Figure 12:
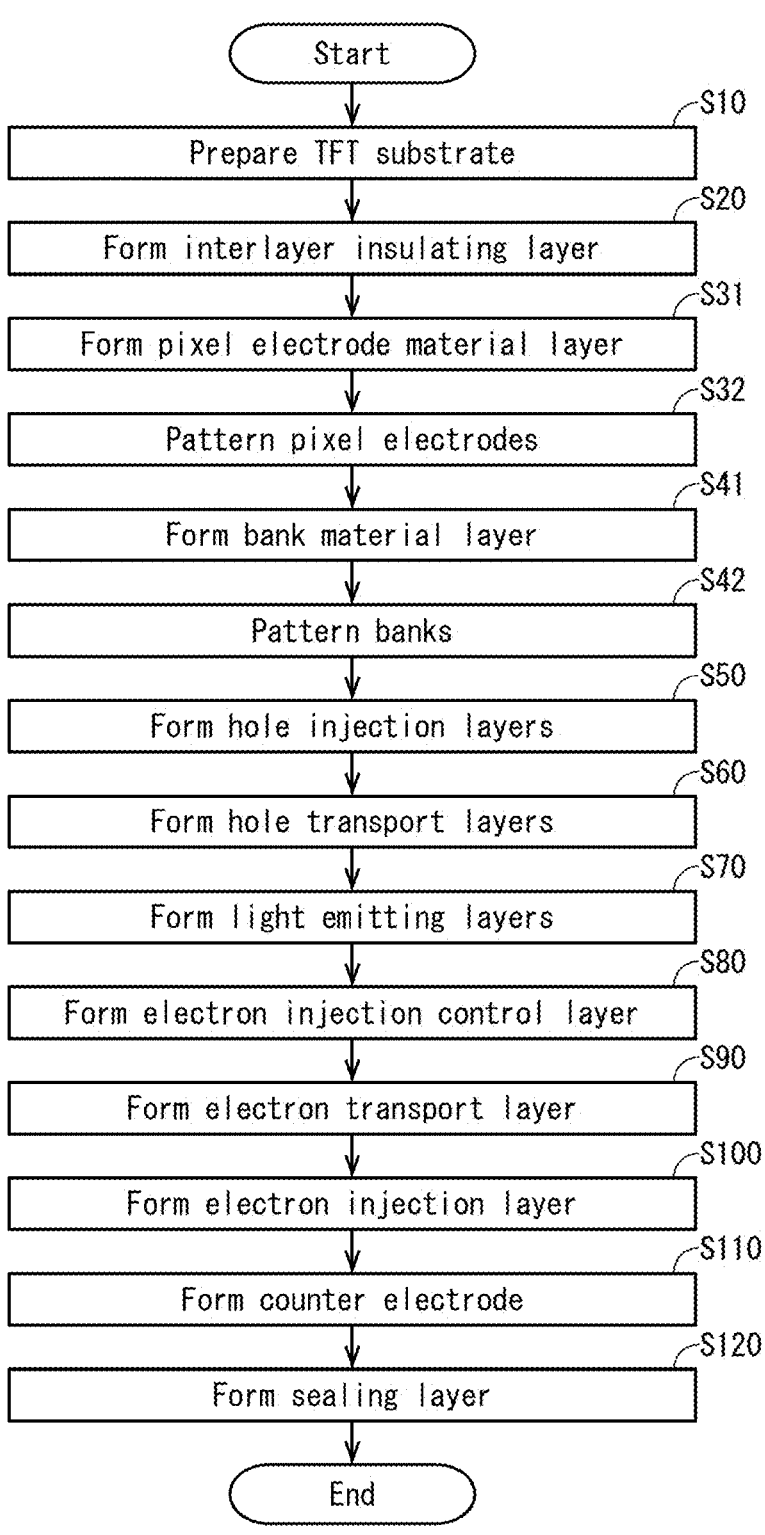
FIG. 12 is a flowchart illustrating the process of manufacturing the organic EL element pertaining to at least one embodiment.

Next, as illustrated in FIG. 11A, the electron injection layer 20 is formed on the electron transport layer 19 (step S100). The electron injection layer 20 is formed, for example, by vapor deposition of an electron transporting organic compound and a metal dopant to form a film common to every sub pixel.

(10) Forming Counter Electrode 21

Figure 11B:
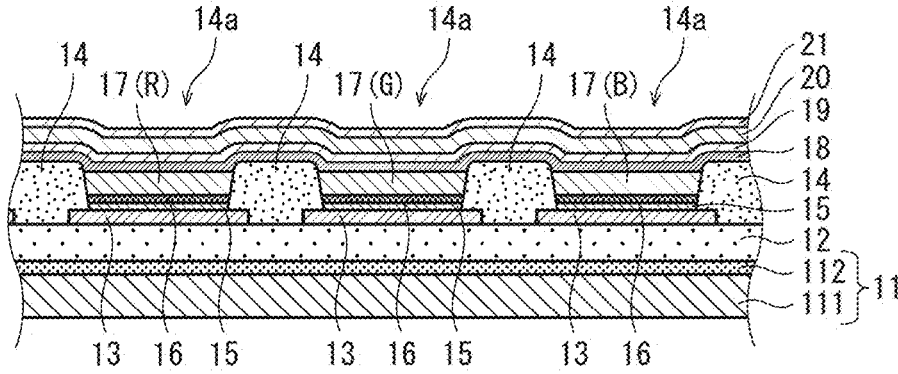

Next, as illustrated in FIG. 11B, the counter electrode 21 is formed on the electron injection layer 20 (step S110). The counter electrode 21 is formed by forming a film of ITO, IZO, silver, aluminum, or the like by a sputtering method or a vacuum vapor deposition method. The counter electrode 21 functions as a cathode of the organic EL elements.

(11) Forming Sealing Layer 22

Figure 11C:
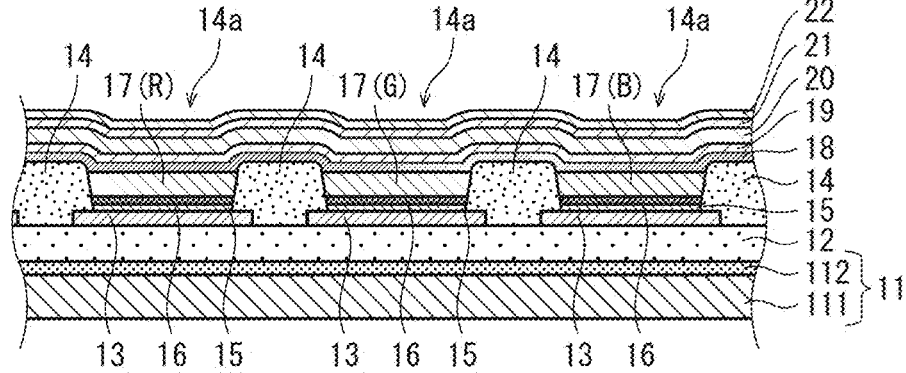

Finally, as illustrated in FIG. 11C, the sealing layer 22 is formed on the counter electrode 21 (step S120). The sealing layer 22 can be formed by forming a film of SiON, SiN, or the like by a sputtering method, a CVD method, or the like. A sealing resin layer may be further applied and baked, or the like, on an inorganic film of SiON, SiN, or the like.

A color filter or an upper substrate may be placed on the sealing layer 22 and bonded.

[6. Overall Structure of Organic EL Display Device]

Figure 13:
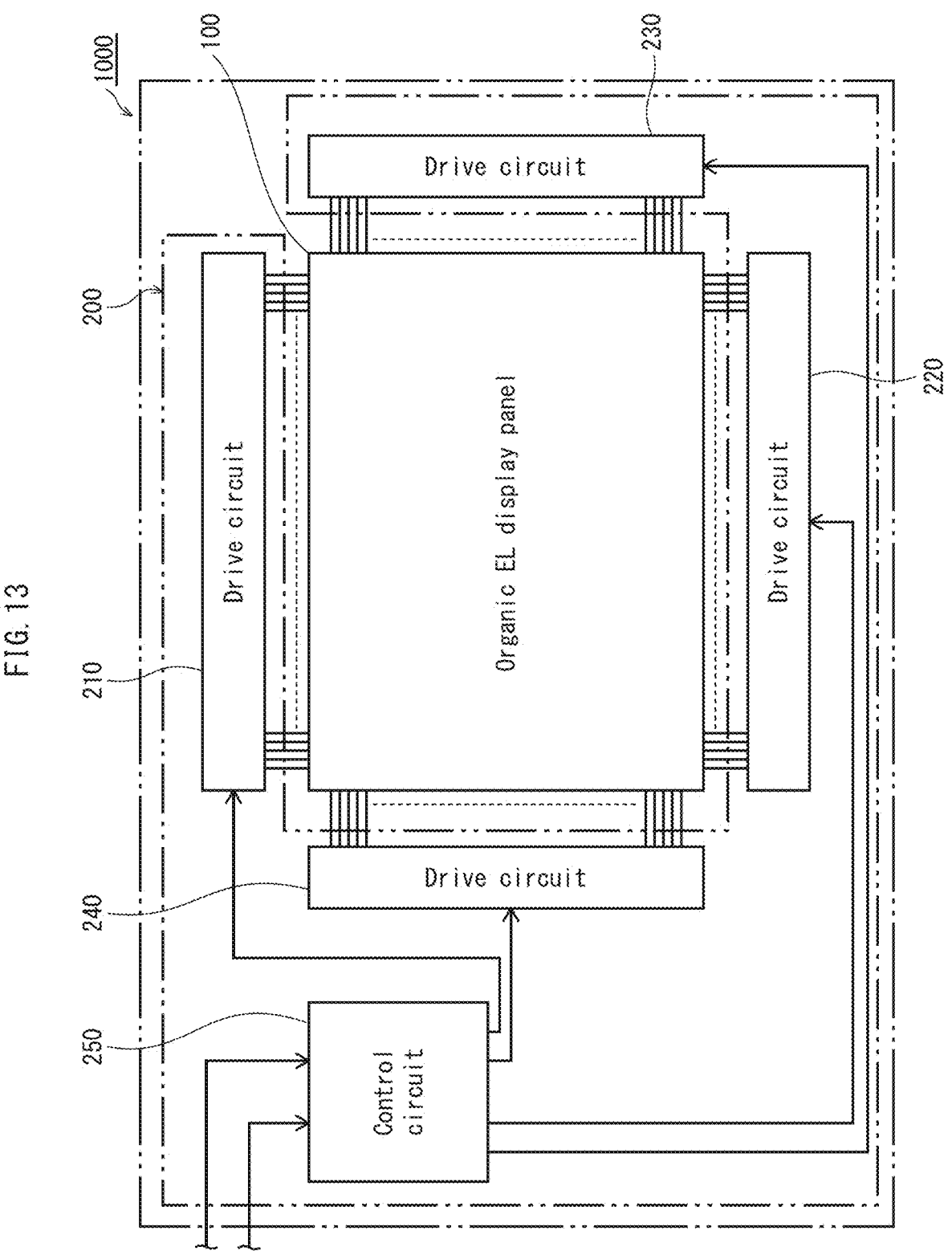
FIG. 13 is a block diagram illustrating a structure of an organic EL display device including organic EL elements according to at least one embodiment.

FIG. 13 is a schematic block diagram illustrating structure of an organic EL display device 1000 including the organic EL display panel 100. As illustrated in FIG. 13, the organic EL display device 1000 includes the organic EL display panel 100 and a drive controller 200 connected to the organic EL display panel 100. The drive controller 200 includes four drive circuits 210, 220, 230, 240 and a control circuit 250.

In the organic EL display device 1000, arrangement of the drive controller 200 with respect to the organic EL display panel 100 is not limited to the example illustrated.

[7. Other Modifications]

(1) According to at least one embodiment, the host material of the light emitting layers 17 has higher hole transportability than electron transportability. However, a material having higher electron transportability than hole transportability may be used as the host material of the light emitting layers 17. In this case, hole injection from the anode side into the light emitting layer 17 is the rate-determining process of recombination in the light emitting layer 17, and therefore it is preferably that electron trapping by the fluorescent material does not occur. Accordingly, the difference between the LUMO level of the host material and the LUMO level of the fluorescent material is preferably small. Further, in this case, a hole injection control layer is preferably provided between the light emitting layer 17 and the hole transport layer 16, the HOMO level of the hole injection control layer is preferably at least 0.1 eV lower than the HOMO level of the hole transport layer 16, and lower than the HOMO level of the host material of the light emitting layer 17. According to this structure, recombination on the anode side of the light emitting layer 17 is suppressed to suppress a decrease in luminance efficiency and deterioration of the hole transport layer, as well as appropriately maintaining carrier balance and improving recombination probability by appropriately controlling hole injection into the light emitting layer 17.

(2) According to at least one embodiment, the organic EL element is provided with an electron injection transport layer, but this is not an essential component. Even in an organic EL element without an electron injection transport layer, the effect of reducing hole trapping by the fluorescent material to improve exciton density of the light emitting layer 17 can be achieved by the HOMO level of the fluorescent material being equal to or greater than the HOMO level of the host material, and a difference in energy level being 0.3 eV or less.

(3) According to at least one embodiment, the hole injection layer 15 and the hole transport layer 16 are essential components, but the present invention is not limited to this. For example, an organic EL element that does not include the hole transport layer 16 may be used. Further, for example, instead of the hole injection layer 15 and the hole transport layer 16, a single hole injection transport layer may be included. Further, according to at least one embodiment, the electron injection layer 20 is provided separately from the electron transport layer 19, but the electron transport layer 19 may also serve as an electron injection layer.

(4) According to at least one embodiment, the organic EL display panel has a top emission structure, but a bottom emission structure may be implemented by using a light transmissive electrode as an anode and a light reflecting electrode as a cathode.

Further, according to at least one embodiment, the anode is a pixel electrode and the cathode is a counter electrode, but the cathode may be a pixel electrode and the anode may be a counter electrode.

Although the organic EL element and the organic EL panel pertaining to the present disclosure have been described based on the embodiments and modifications above, the present disclosure is not limited to the embodiment and modifications described above. For example, various embodiments and modifications achievable by a person having ordinary skill in the art, and any combination of elements and functions of embodiments and modifications that do not depart from the spirit of the present invention are also included in the present invention.

What is claimed is:

1. An organic electroluminescence (EL) element comprising:

an anode;

a cathode; and a light emitting layer disposed between the anode and the cathode, wherein the light emitting layer comprises a fluorescent material and a host material, the host material being an amine compound, the difference between the lowest unoccupied molecular orbital (LUMO) level of the fluorescent material and the highest occupied molecular orbital (HOMO) level of the fluorescent material is less than or equal to the difference between the LUMO level and the HOMO level of the host material, the emission intensity of the light-emitting layer at any time/after an application of current is cut off is I(t), and I(t) changes according to the $R_{TTF}$, in which $R_{TTF}$ is the contribution of triplet-triplet fusion (TTF) to the emission efficiency, the LUMO level of the fluorescent material is equal to or higher than the LUMO level of the host material, the HOMO level of the fluorescent material is equal to or higher than the HOMO level of the host material, and the difference in energy level between the HOMO level of the fluorescent material and the HOMO level of the host material is 0.3 eV or less, the $R_{TTF}$ is set to a value exceeding 20% by setting $\Delta$HOMO to a value below 0.3 eV, $\Delta$HOMO is the difference in energy level between the HOMO levels of the fluorescent material and the host material, the hole mobility of the light emitting layer is higher than the electron mobility of the light emitting layer, and a distance between the light emission center of the light emitting layer and a cathode-side surface of the light emitting layer is shorter than the distance between the light emission center and the anode-side surface of the light emitting layer, the relationship between the emission intensity I(t) at time t and the RTTF is based on the following equation $$\frac{1}{\sqrt{I(t)}} = \frac{1}{\sqrt{R_{TTF}}} + At$$

in which A is a constant.

2. The organic EL element of claim 1, further comprising an electron injection control layer and an intermediate layer between the light emitting layer and the cathode, wherein:

the hole mobility of the light emitting layer is higher than the electron mobility of the light emitting layer, Eg(eicl) is set to a first threshold or more, Eg(eicl) is the energy gap when injecting electrons from the electron transport layer to the electron injection control layer, Eg(eml) is set to a second threshold or less, Eg(eml) is the energy gap when injecting electrons from the electron injection control layer to the light emitting layer, the first threshold is a threshold for accumulating holes near the interface between the light emitting layer and the electron injection control layer, and the second threshold is a threshold for making the recombination region of electrons and holes in the light emitting layer near the interface between the light emitting layer and the electron injection control layer.

3. The organic EL element of claim 1, wherein energy of singlet excitons of the host material is equal to or higher than the energy of singlet excitons of the fluorescent material, a hole injection layer and a hole transport layer are provided between the anode and the light-emitting layer, and $\Delta$HOMO adjusts the trapping of holes injected from the hole transport layer to the light-emitting layer by the fluorescent material.

4. The organic EL element of claim 1, further comprising:

an electron injection control layer and an intermediate layer between the light emitting layer and the cathode, wherein the electron injection control layer is in contact with both the light emitting layer and the intermediate layer, the intermediate layer has at least one of a property of facilitating electron injection and a property of facilitating electron transport, the electron injection control layer comprises a functional material, the intermediate layer comprises a functional material, and the LUMO level of the functional material contained in the electron injection control layer is 0.1 eV or more higher than the LUMO level of the functional material contained in the intermediate layer and is higher than the LUMO level of the host material.

5. An organic electroluminescence (EL) panel comprising a plurality of the organic EL element of claim 1 disposed on a substrate.

6. An organic electroluminescence (EL) element manu- facturing method comprising:

forming a first electrode on a substrate;

forming a light emitting layer above the first electrode; and forming a second electrode above the light emitting layer, wherein in the forming of the light emitting layer, a fluorescent material and a host material are used as materials of the light emitting layer, the host material is an amine compound, and the fluorescent material and the host material are selected such that the difference between the lowest unoccupied molecular orbital (LUMO) level of the fluorescent material and the highest occupied molecular orbital (HOMO) level of the fluorescent material is less than or equal to the difference between the LUMO level and the HOMO level of the host material, an emission intensity of the light-emitting layer at any time t after an application of current is cut off is I(t), and I(t) changes according to the $R_{TTF}$, in which $R_{TTF}$ is the contribution of triplet-triplet fusion (TTF) to the emis- sion efficiency, the LUMO level of the fluorescent material is equal to or higher than the LUMO level of the host material, the HOMO level of the fluorescent material is equal to or higher than the HOMO level of the host material, the $R_{TTF}$ is set to a value exceeding 20% by setting $\Delta$HOMO to a value below 0.3 eV, $\Delta$HOMO is the difference in energy level between the HOMO levels of the fluorescent material and the host material, the hole mobility of the light emitting layer is higher than the electron mobility of the light emitting layer, and a distance between the light emission center of the light emitting layer and a cathode-side surface of the light emitting layer is shorter than the distance between the light emission center and the anode-side surface of the light emitting layer, the relationship between the emis- sion intensity I(t) at time t and the RTTF is based on the following equation, $$\frac{1}{\sqrt{I(t)}} = \frac{1}{\sqrt{R_{TTF}}} + At$$

in which A is a constant.

\* \* \* \* \*